(12) United States Patent
Kaneda et al.

(10) Patent No.: US 8,872,316 B2
(45) Date of Patent: Oct. 28, 2014

(54) MANUFACTURING METHOD OF SEMICONDUCTOR DEVICE AND SEMICONDUCTOR DEVICE

(71) Applicant: Renesas Electronics Corporation, Kawasaki (JP)

(72) Inventors: Yoshiharu Kaneda, Kawasaki (JP); Naoko Taniguchi, Kawasaki (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/968,289

(22) Filed: Aug. 15, 2013

(65) Prior Publication Data
US 2014/0070389 A1    Mar. 13, 2014

(30) Foreign Application Priority Data
Sep. 7, 2012 (JP) .................. 2012-197142

(51) Int. Cl.
*H01L 23/00* (2006.01)
*H01L 23/495* (2006.01)
*H01L 21/56* (2006.01)

(52) U.S. Cl.
CPC . *H01L 23/49503* (2013.01); *H01L 2224/92247* (2013.01); *H01L 24/97* (2013.01); *H01L 2224/48247* (2013.01); *H01L 2224/73265* (2013.01); *H01L 2224/32245* (2013.01); *H01L 23/49575* (2013.01); *H01L 23/49541* (2013.01); *H01L 21/565* (2013.01)

USPC ..................... 257/676; 257/667; 438/123

(58) Field of Classification Search
USPC ........... 257/676, 667, 787; 438/123, 121, 127
See application file for complete search history.

(56) References Cited

U.S. PATENT DOCUMENTS

| 5,757,066 A | * | 5/1998 | Inoue et al. | 257/666 |
| 5,869,883 A | * | 2/1999 | Mehringer et al. | 257/667 |
| 6,528,868 B1 | | 3/2003 | Weiblen et al. | |

FOREIGN PATENT DOCUMENTS

JP    2002-505523 A    2/2002

* cited by examiner

*Primary Examiner* — Roy Potter
(74) *Attorney, Agent, or Firm* — McGinn IP Law Group, PLLC

(57) ABSTRACT

To enhance the reliability of a semiconductor device. The semiconductor device includes die pads, over which a first semiconductor chip and a second semiconductor chip are mounted respectively, a plurality of support pins that support each of the die pads, a plurality of inner leads and outer leads arranged around the die pads, a plurality of wires that electrically couple the semiconductor chips to the inner leads, and a sealing body that seals the semiconductor chips, the inner leads, and the wires. Each of the die pads is supported by three support pins integrally formed together with the die pad, and each of second support pins of each pair of the three support pins is arranged between the inner leads adjacent to each other.

15 Claims, 24 Drawing Sheets

MANUFACTURING METHOD OF SEMICONDUCTOR DEVICE AND SEMICONDUCTOR DEVICE

CROSS-REFERENCE TO RELATED APPLICATION

The disclosure of Japanese Patent Application No. 2012-197142 filed on Sep. 7, 2012 including the specification, drawings and abstract is incorporated herein by reference in its entirety.

BACKGROUND

The present invention relates to a semiconductor device and a manufacturing method of the semiconductor device, and relates to, for example, a semiconductor device including support pins that support a die pad and to an effective technique to be applied to assembling the semiconductor device.

For example, as a lead frame device, Japanese Unexamined Patent Application Publication (Translation of PCT Application) No. 2002-505523 (Patent Document 1) discloses a structure including a lead frame manufactured from a first material, a lot of leads, and a die pad manufactured from a second material.

SUMMARY

In a semiconductor device (semiconductor package) including support pins (also referred to as "support leads") that support a die pad (also referred to as an "island") on which a semiconductor chip is mounted, the support pins are arranged at, for example, corner portions or on opposing sides of the die pad and appropriately support the die pad.

Also in a semiconductor device having a structure in which a plurality of die pads is arranged in a row in order to mount a plurality of semiconductor chips, each die pad can be supported by three support pins (supported by three points) by using leads connected to outer leads also as support pins of the die pads, and thus the reliability of die bonding, wire bonding and the like is ensured.

However, when trying to increase the number of pins without changing the size (appearance size) of the semiconductor device main body for functional enhancement of the semiconductor device, it is necessary to provide an independent lead for a signal by reducing the number of support pins that support the die pad, and thus the number of support pins decreases and the die pad is supported by two points.

As a result, the support state of the die pad becomes unstable. Therefore, if an external load is applied to the die pad in an assembling process of the semiconductor device, the die pad is deformed or vibrated in the vertical direction, and thus trouble may occur in the process or the semiconductor chips and wires are damaged.

That is, in a die bonding process and a wire bonding process, a bonding failure may occur because the die pad vertically moves (vibrates) and sufficient load is not applied to the die pad, or in a resin molding process, the die pad vertically moves (vibrates), and thus the semiconductor chip and wires are damaged, resulting in a failure of wire disconnection or the like.

Note that, in the lead frame device disclosed in Patent Document 1, binding bars (the support pins) are manufactured from the first material and the die pad is manufactured from the second material. Therefore, the lead frame device has a frame structure in which the support pins and the die pad are formed of different materials and thereafter the support pins and the die pad are coupled to each other.

In such a frame structure, a coupling portion to the support pins is required in the die pad, and thus the die pad has to be considerably larger than the chip size. That is, the die pad cannot be reduced to the size as small as the chip size, and thus it is not possible to employ the above frame structure, in which, in a small semiconductor device, the support pins and the die pad are formed as different parts and thereafter they are coupled to each other.

An object of an embodiment disclosed in the present application is to provide a technique capable of enhancing the reliability of a semiconductor device.

The other problems and the new feature will become clear from the description of the present specification and the accompanying drawings.

A manufacturing method of a semiconductor device according to an embodiment includes the steps of providing a lead frame including a plurality of die pads and plurality of support pins, mounting a semiconductor chip over the die pads, electrically coupling, through wires, electrode pads of the semiconductor chip to inner leads, and forming a sealing body that seals the support pins, the semiconductor chip, and the wires. Furthermore, in the manufacturing method of a semiconductor device, the support pins include a first support pin connected to an outer lead, a second support pin that is arranged between two of the inner leads and that is connected to a tie bar, and a third support pin connected to a side of the die pad different from sides to which the first support pin and the second support pin are connected. The first, the second, and the third support pins are integrally formed together with each of the die pads.

According to the embodiment described above, it is possible to enhance the reliability of the semiconductor device.

DETAILED DESCRIPTION

In the embodiment described below, the description of the same or a similar portion is not repeated unless particularly required.

Furthermore, the following embodiment will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiment, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiment, it is needless to say that an element (including an element step etc.) is not necessarily indispensable, except for the case where it is clearly specified in particular and where it is considered to be clearly indispensable from a theoretical point of view, etc.

In the following embodiment, regarding an element etc., it is needless to say that "comprise A", "consist of A", "have A", and "include A" do not exclude elements other than A, except for the case where it is clearly specified that the element is only A. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

Hereinafter, the embodiment will be explained on the basis of the drawings. In all the drawings for explaining embodiments, the same symbol is attached to the same member and the repeated explanation thereof is omitted. In order to make a drawing intelligible, hatching may be attached even if it is a plan view.

Embodiment

Figure 1:
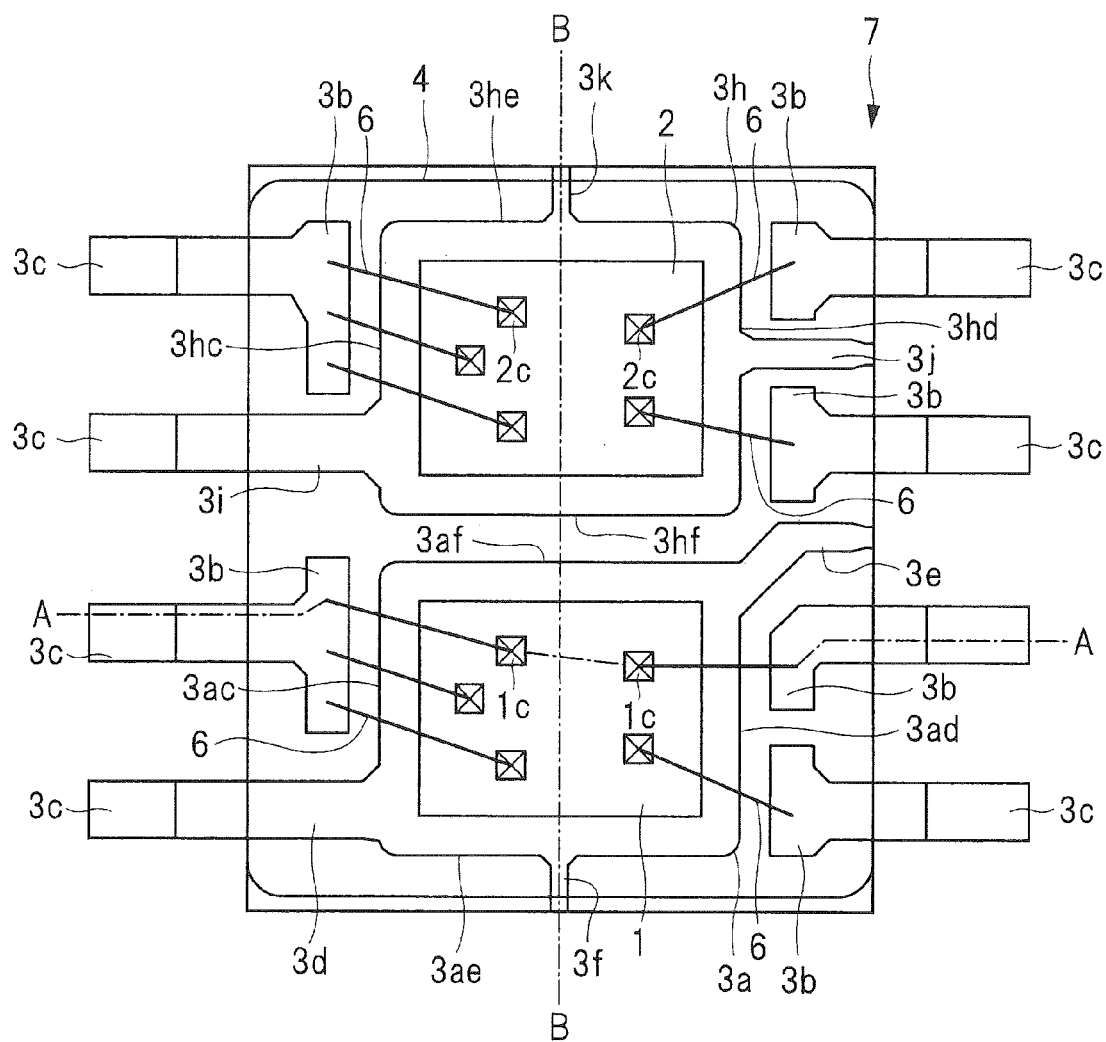
FIG. 1 is a plan view showing an example of a structure of a semiconductor device of an embodiment as seen through a sealing body.
Figure 2:
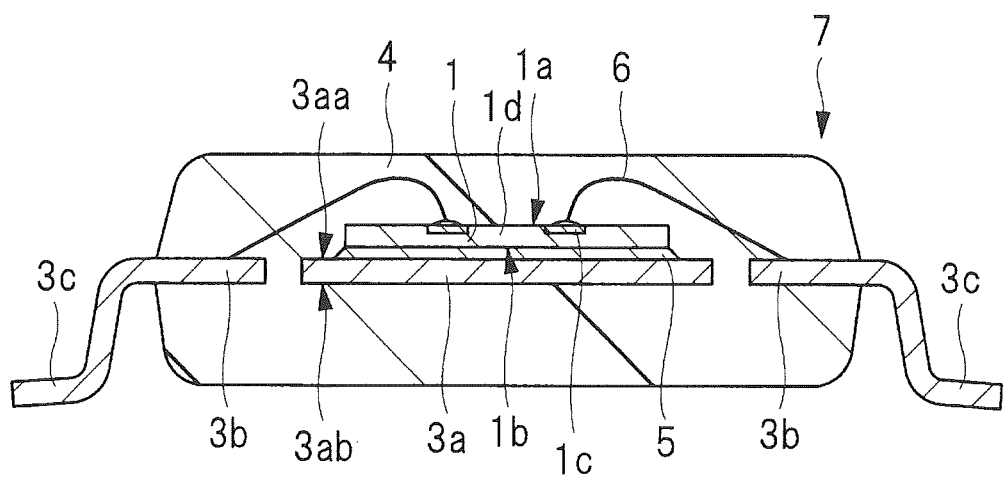
FIG. 2 is a cross-sectional view showing an example of a structure taken along A-A line in FIG. 1.
Figure 3:
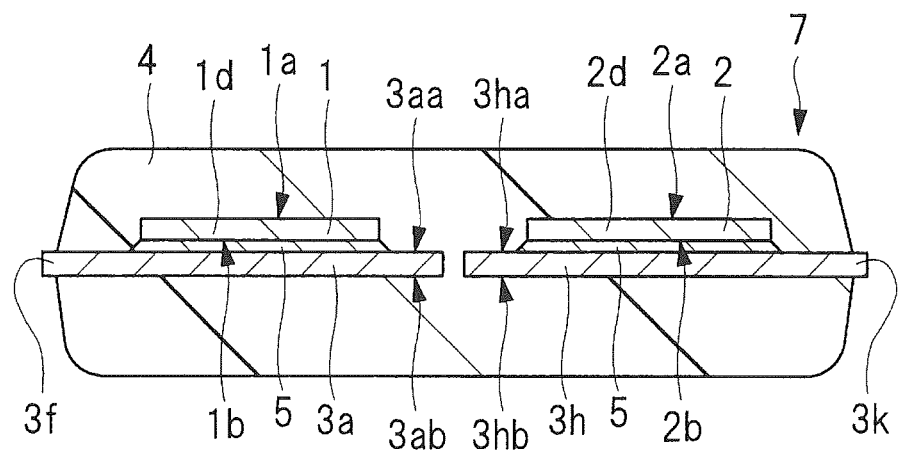
FIG. 3 is a cross-sectional view showing an example of a structure taken along B-B line in FIG. 1.

FIG. 1 is a plan view showing an example of a structure of a semiconductor device of the embodiment as seen through a sealing body. FIG. 2 is a cross-sectional view showing an example of a structure taken along A-A line in FIG. 1. FIG. 3 is a cross-sectional view showing an example of a structure taken along B-B line in FIG. 1.

The semiconductor device of the embodiment shown in FIGS. 1 to 3 is a frame-type semiconductor package assembled by using a dual island-type lead frame 3 shown in FIG. 8 described below. In the present embodiment, as an example of the above-mentioned semiconductor device, a resin sealing-type 8-pin SOP (Small Outline Package) 7 is taken up and a structure and a manufacturing method of the SOP 7 will be described. That is, the semiconductor device of the present embodiment includes a plurality of die pads (islands, tabs), and in the present embodiment, the SOP 7 including two die pads will be taken up and described.

First, a structure of the SOP 7 will be described with reference to FIGS. 1 to 3. The SOP 7 includes a semiconductor chip 1 in which a semiconductor element (semiconductor integrated circuit) 1d is formed, a semiconductor chip 2 in which a semiconductor element 2d is formed, a die pad 3a on which a semiconductor chip 1 is mounted, and a die pad 3h on which a semiconductor chip 2 is mounted.

That is, the die pad 3a and the die pad 3h, which are two chip mounting portions, are arranged side by side, and the semiconductor chip 1 is mounted on an upper surface 3aa of the die pad 3a via a die bonding paste 5 formed of a solder paste. In contrast, the semiconductor chip 2 is mounted on an upper surface 3ha of the die pad 3h via the same die bonding paste 5 formed of a solder paste.

Furthermore, the SOP 7 includes a plurality of (six) inner leads 3b arranged around the die pads 3a and 3h, a plurality of (eight) outer leads 3c integrally formed together with the inner leads 3b, and a plurality of wires 6 which electrically couple the semiconductor chips 1 and 2 to the inner leads 3b.

That is, in the SOP 7 of the present embodiment, the leads electrically coupled to electrode pads 1c and 2c via the wires 6 are defined as the inner leads 3b, and there are six inner leads 3b coupled to the wires 6, and the six inner leads 3b are connected to the outer leads 3c.

In addition, first support pins 3d and 3i of three support pins that support the die pad 3a or 3h are coupled to the outer leads 3c respectively. Therefore, there are a total of eight outer leads 3c including six outer leads 3c coupled to the inner leads 3b and two outer leads 3c coupled to the first support pins 3d and 3i.

Note that the outer lead 3c is not connected to a second support pin 3e, a third support pin 3f, a second support pin 3j, and a third support pin 3k.

In addition, as shown in FIGS. 1 and 2, a plurality of electrode pads is formed on a front surface (main surface) 1a of the semiconductor chip 1 is electrically coupled to a plurality of inner leads 3b corresponding to the electrode pads 1c, respectively, through a plurality of wires 6. In contrast, a plurality of electrode pads 2c formed on a front surface (main surface) 2a of the semiconductor chip 2 are electrically coupled to a plurality of inner leads 3b corresponding to the electrode pads 2c, respectively, through a plurality of wires 6.

Note that, since the SOP 7 is a wire bonding type, the semiconductor chip 1 is face-up mounted over the upper surface 3aa of the die pad 3a with the main surface (front surface) 1a facing up.

That is, the upper surface 3aa of the die pad 3a and a back surface 1b of the semiconductor chip 1 arranged so as to face the upper surface 3aa are coupled to each other via the die bonding paste 5.

In contrast, the semiconductor chip 2 is face-up mounted over the upper surface 3ha of the die pad 3h with the main surface (front surface) 2a facing up. That is, the upper surface 3ha of the die pad 3h and a back surface 2b of the semiconductor chip 2 arranged so as to face the upper surface 3ha are coupled to each other via the die bonding paste 5.

Furthermore, the electrode pads 1c formed on the front surface 1a of the semiconductor chip 1 are electrically coupled to the inner leads 3b, respectively, via the wires 6. Thereby, the semiconductor chip 1, the inner leads 3b, and the outer leads 3c functioning as external terminals are electrically coupled to each other.

That is, one end of each of the wires 6 is electrically coupled to the electrode pad 1c of the semiconductor chip 1. In contrast, the other end of each of the wires 6 is electrically coupled to the inner lead 3b corresponding to each wire 6. In the same manner, the electrode pads 2c formed on the front surface 2a of the semiconductor chip 2 are also electrically coupled to the inner leads 3b, respectively, via the wires 6. Thereby, the semiconductor chip 2, the inner leads 3b, and the outer leads 3c functioning as external terminals are electrically coupled to each other.

In addition, one end of each of the wires 6 is electrically coupled to the electrode pad 2c of the semiconductor chip 2. In contrast, the other end of each of the wires 6 is electrically coupled to the inner lead 3b corresponding to each wire 6.

Furthermore, the die pads 3a and 3h have the upper surfaces 3aa and 3ha, respectively, whose plan view is substantially rectangular, and have lower surfaces 3ab and 3hb, respectively, opposite to the upper surfaces 3aa and 3ha, and each of the die pads 3a and 3h is supported by three support pins.

That is, the die pad 3a is supported by the first support pin 3d connected to the outer lead 3c, the second support pin 3e arranged between two inner leads 3b adjacent to each other, and the other third support pin 3f. In the same way, the die pad 3h is also supported by the first support pin 3i connected to the outer lead 3c, the second support pin 3j arranged between two inner leads 3b adjacent to each other, and the other third support pin 3k.

Note that the upper surface 3aa of the die pad 3a includes a first side 3ac, a second side 3ad, a third side 3ae and a fourth side 3af, and the first support pin 3d is connected to the first side 3ac and the second support pin 3e is connected to the second side 3ad opposite to the first side 3ac. Furthermore, the third support pin 3f is coupled to the third side 3ae different from both the first side 3ac to which the first support pin 3d is connected and the second side 3ad to which the second support pin 3e is connected.

In contrast, in the same manner as in the die pad 3a, the upper surface aha of the die pad 3h includes a first side 3hc, a second side 3hd, a third side 3he and a fourth side 3hf, and the first support pin 3i is connected to the first side 3hc and the second support pin 3j is connected to the second side 3hd opposite to the first side 3hc. Furthermore, the third support pin 3k is connected to the third side 3he different from both the first side 3hc to which the first support pin 3i is connected and the second side 3hd to which the second support pin 3j is connected.

Moreover, the first support pin 3d, the second support pin 3e, and the third support pin 3f are integrally formed together with the die pad 3a. In contrast, the first support pin 3i, the second support pin 3j, and the third support pin 3k are integrally formed together with the die pad 3h.

Note that no support pin is connected to the fourth side 3af of the die pad 3a and the fourth side 3hf of the die pad 3h, and the die pad 3a and the die pad 3h are arranged so that the fourth side 3af and the fourth side 3hf face each other.

In addition, the SOP 7 of the present embodiment is formed of a sealing resin 8 shown in FIG. 6 described later and includes the semiconductor chips 1 and 2, the die pads 3a and 3h, the wires 6, the inner leads 3b, and a sealing body 4 that seals each support pin (3d, 3e, 3f, 3i, 3j, and 3k).

Meanwhile, it is preferable that the second support pin 3e that supports the die pad 3a and the second support pin 3j that supports the die pad 3h are terminated inside the sealing body. This is because, in a process of separating, from the lead frame 3, the support pins in an assembling process of the semiconductor device described later, there is employed an assembling method in which the second support pins 3e and 3j are torn off by a resin injection pressure in a sealing process and thereafter the tips of the second support pins 3e and 3j are covered by a resin.

Therefore, in the SOP 7, the tips of the respective second support pins 3e and 3j are buried inside the sealing body 4. However, the third support pins 3f and 3k are slightly exposed to the outside of the sealing body 4 as shown in FIG. 3 since, in a process of separating, from the lead frame 3, the support pins in the assembling process, there is employed an assembling method in which the third support pins 3f and 3k are cut off after a resin sealing process.

Note that, as to a method of separating the second support pins 3e and 3j from the lead frame 3, a method may be employed in which the second support pins 3e and 3j are cut off after the resin sealing process in the same manner as the third support pins 3f and 3k, and in this case, the second support pins 3e and 3j are slightly exposed to the outside of the sealing body 4 in the same manner as the third support pins 3f and 3k.

Here, the inner leads 3b, the outer leads 3c, the support pins, and the die pads 3a and 3h are formed of a thin plate member formed of, for example, a copper alloy, an iron-nickel alloy, or the like. In addition, the sealing body 4 includes, for example, a thermosetting epoxy resin and is formed in the resin sealing process.

The wires 6 are, for example, gold (Au) wires or copper (Cu) wires.

Furthermore, since the semiconductor device is the SOP 7, as shown in FIG. 2, the outer leads 3c which are integrally formed together with the inner leads 3b respectively, protrude outward from the side surfaces of the sealing body 4 in two directions opposite to each other, and each of the outer leads 3c is bent and formed into a gull-wing shape.

Next, the assembling of the semiconductor device (SOP 7) of the present embodiment will be described with reference to a flowchart shown in FIG. 4. That is, in the present embodiment, as an example of the semiconductor device, an assembling of an 8-pin dual island-type SOP 7 will be described.

Figure 4:
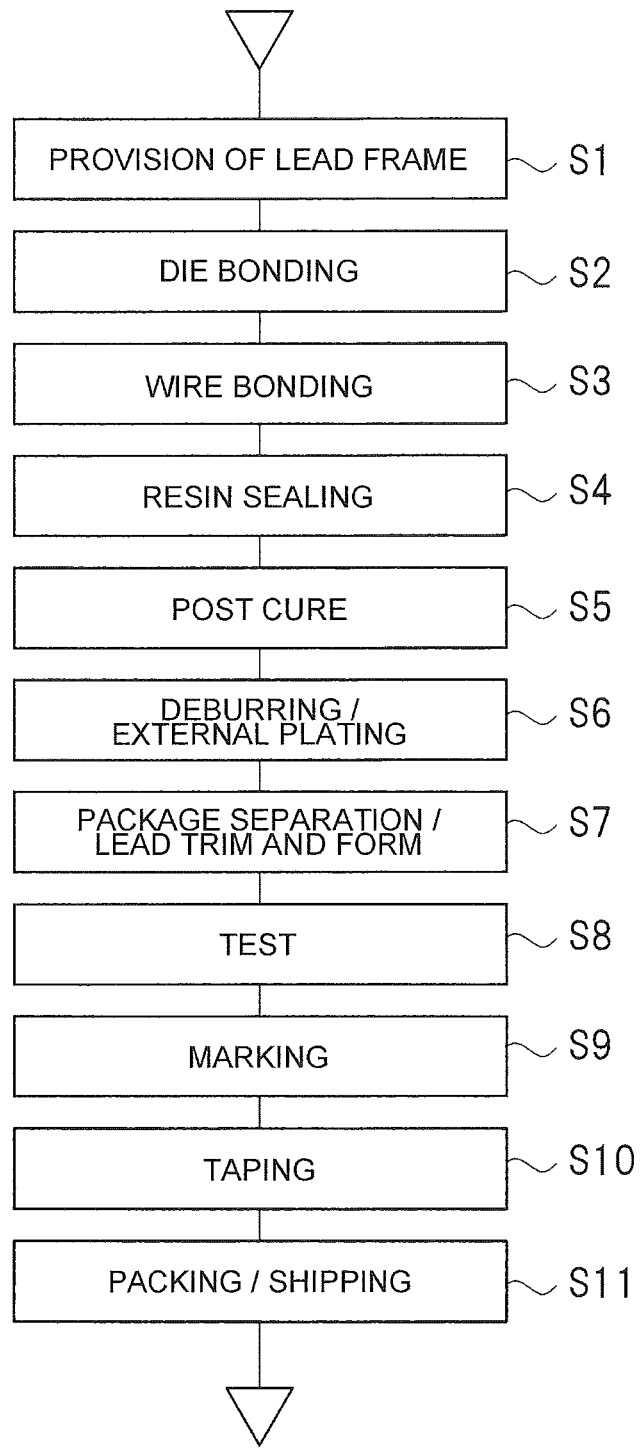
FIG. 4 is a flowchart showing an example of an assembling procedure of the semiconductor device shown in FIG. 1.
Figure 5:
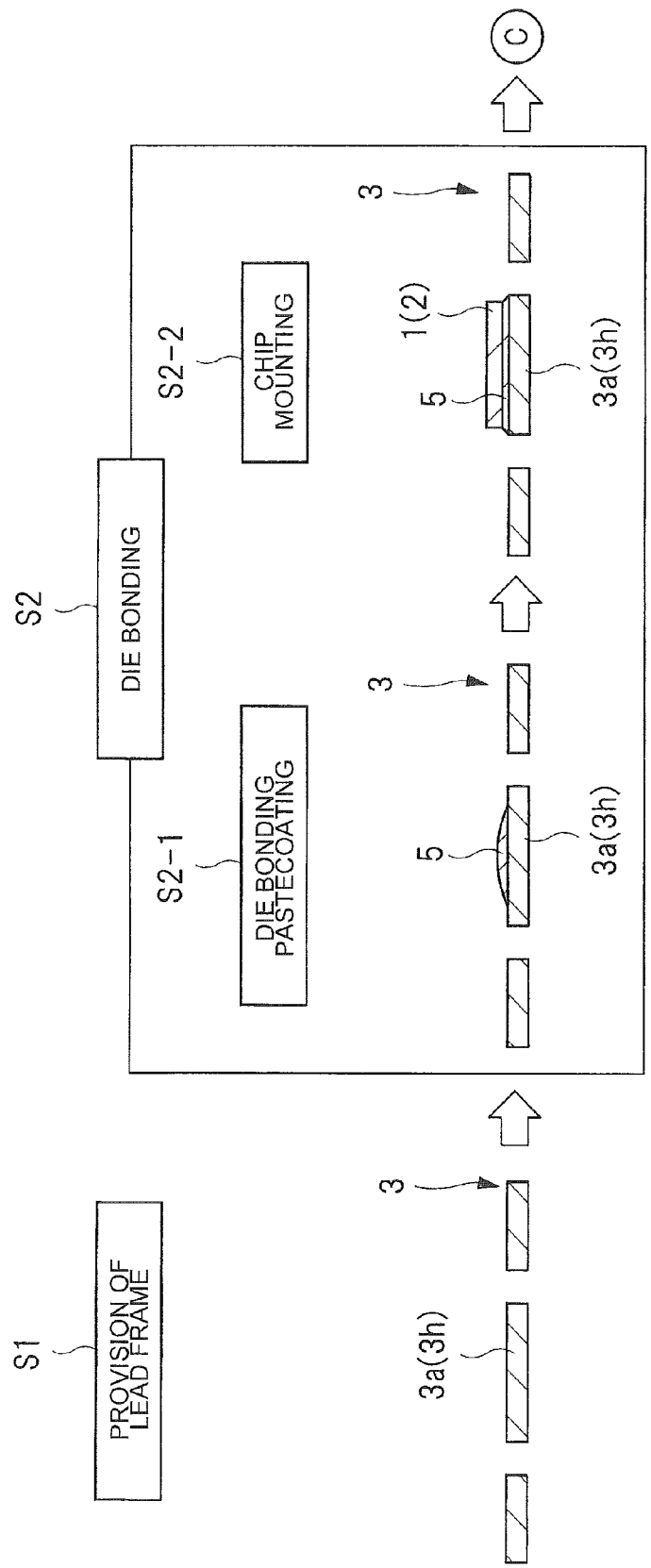
FIG. 5 is a process flow diagram showing an example of the partial assembling procedure shown in FIG. 4.
Figure 6:
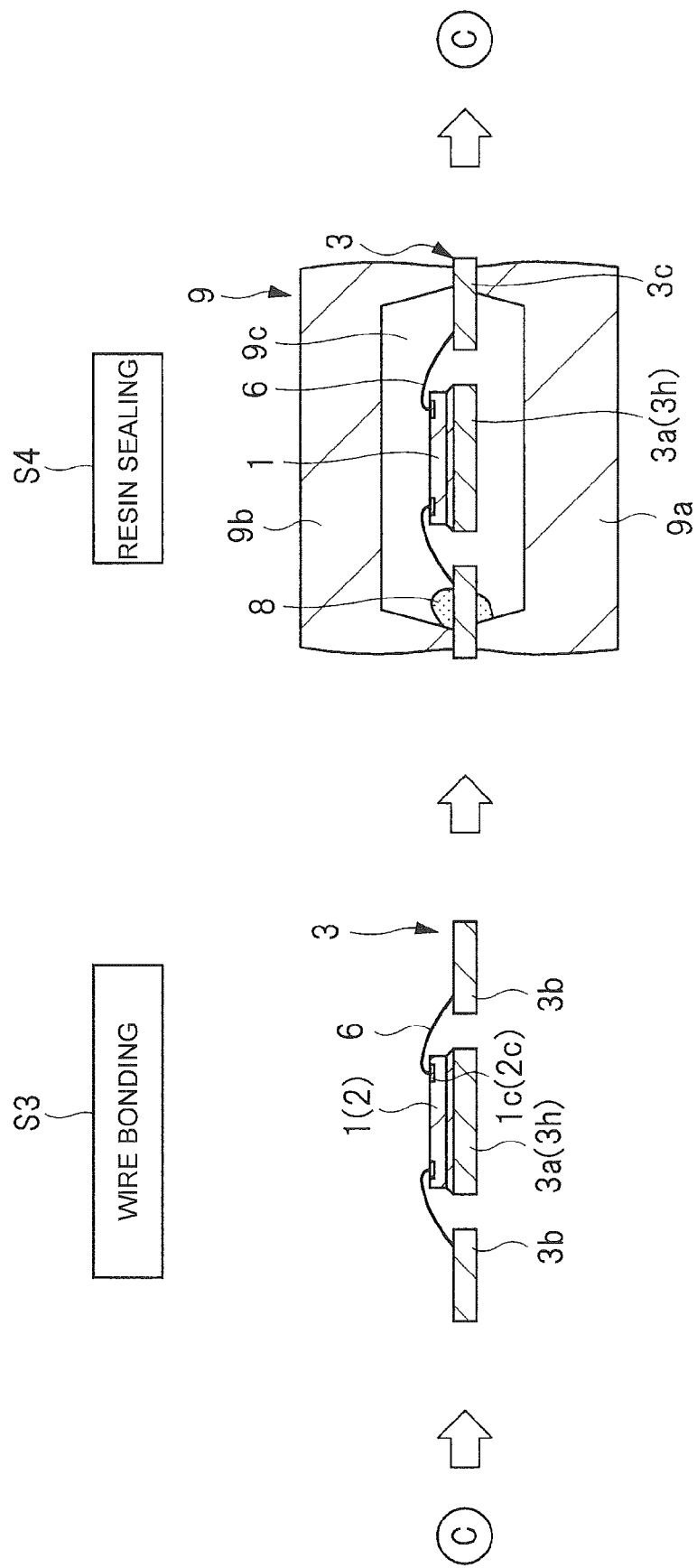
FIG. 6 is a process flow diagram showing an example of the partial assembling procedure shown in FIG. 4.
Figure 7:
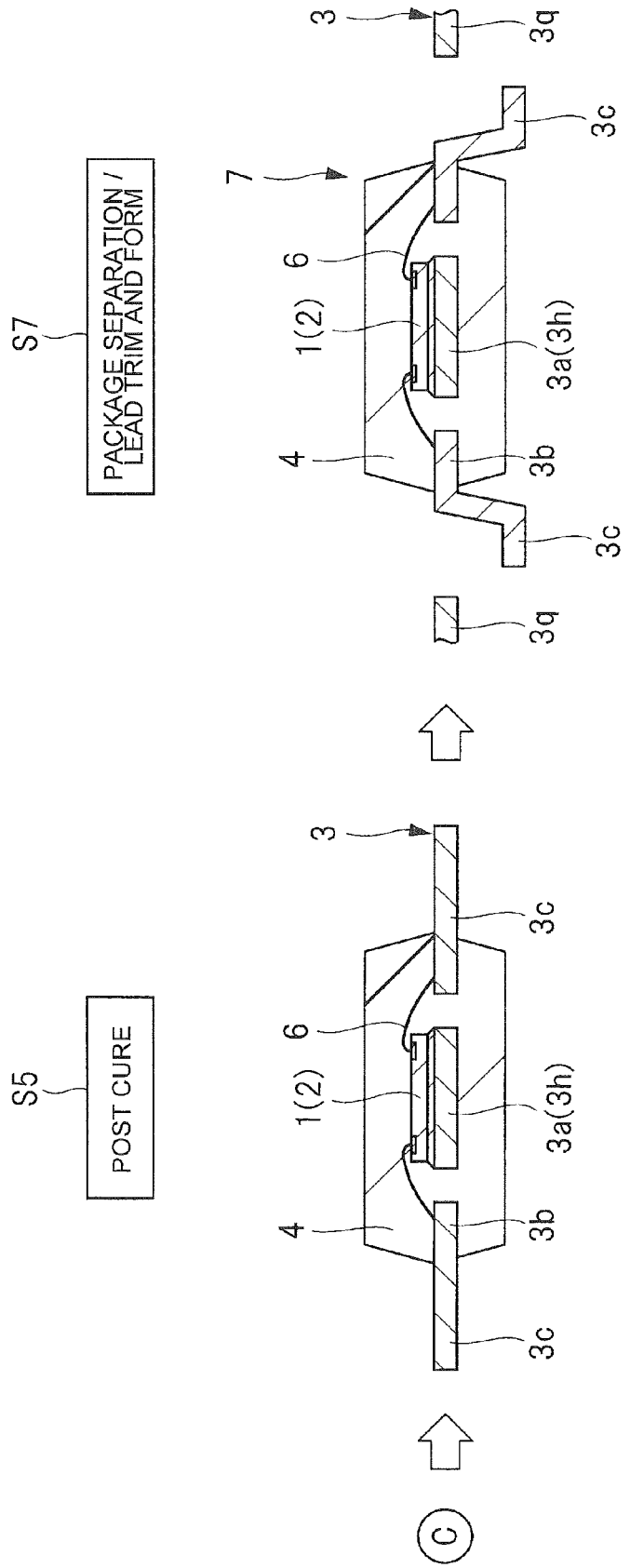
FIG. 7 is a process flow diagram showing an example of the partial assembling procedure shown in FIG. 4.
Figure 9:
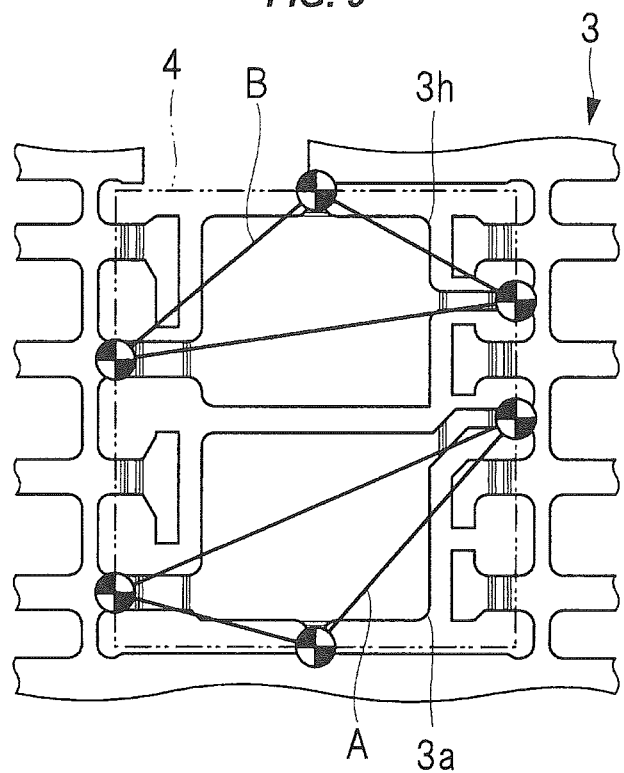
FIG. 9 is a partial plan view showing stability of a die pad of the lead frame shown in FIG. 8.
Figure 10:
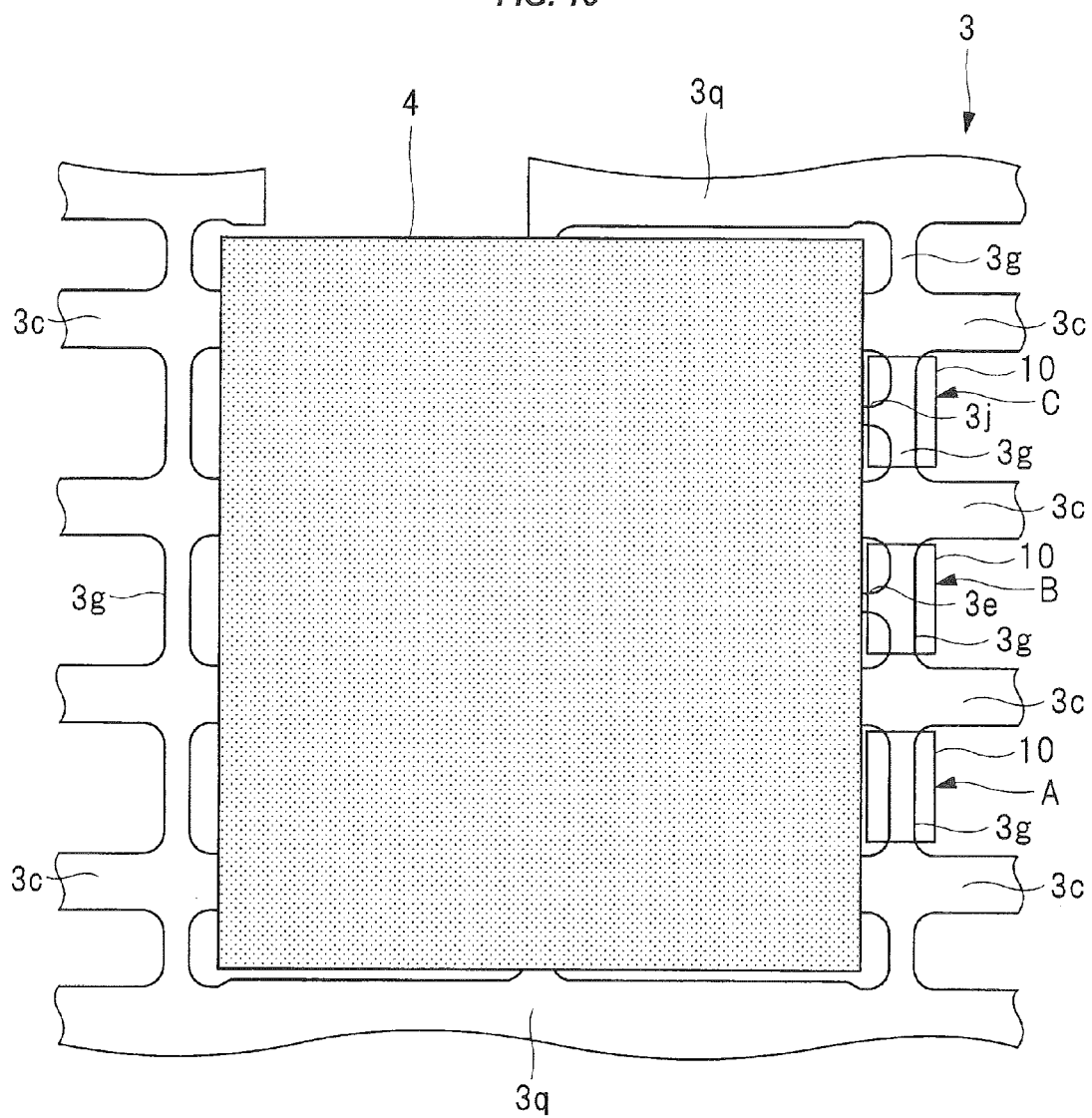
FIG. 10 is an enlarged partial plan view showing an example of a separation method of second support pins in a package separation process in the assembling of the semiconductor device shown in FIG. 1.

FIG. 4 is a flowchart showing an example of an assembling procedure of the semiconductor device shown in FIG. 1, FIG. 5 is a process flow diagram showing an example of the partial assembling procedure shown in FIG. 4, FIG. 6 is a process flow diagram showing an example of the partial assembling procedure shown in FIG. 4, and FIG. 7 is a process flow diagram showing an example of the partial assembling procedure shown in FIG. 4. In addition, FIG. 8 is an enlarged partial plan view showing an example of the structure of the lead frame used in the assembling of the semiconductor device shown in FIG. 1. FIG. 9 is a partial plan view showing stability of the die pad of the lead frame shown in FIG. 8. FIG. 10 is an enlarged partial plan view showing an example of a separation method of the second support pins in a package separation process in the assembling of the semiconductor device shown in FIG. 1.

First, the provision of the lead frame shown in step S1 in FIGS. 4 and 5 is performed. In the present embodiment, as shown in FIG. 8, there is provided the lead frame 3 in which two die pads (islands) 3a and 3h and two pairs of three support pins supporting the two die pads 3a and 3h, respectively, are provided. Furthermore, the lead frame 3 is provided with the inner leads 3b arranged around the two die pads 3a and 3h, the outer leads 3c connected to the inner leads 3b respectively, and tie bars 3g that couple the outer leads to each other.

Each outer lead 3c arranged at an end portion of an outer lead array is connected to a frame portion 3q through the tie bar 3g.

Here, the die pad 3a and the die pad 3h are arranged side by side and have the upper surfaces 3aa and 3ha, respectively, whose planar view is substantially rectangular, and have the lower surfaces 3ab and 3hb, respectively, opposite to the upper surfaces 3aa and 3ha (see FIG. 3). Each of the die pads 3a and 3h is supported by three support pins. That is, each of the die pads 3a and 3h is supported at three points by the support pins.

Figure 8:
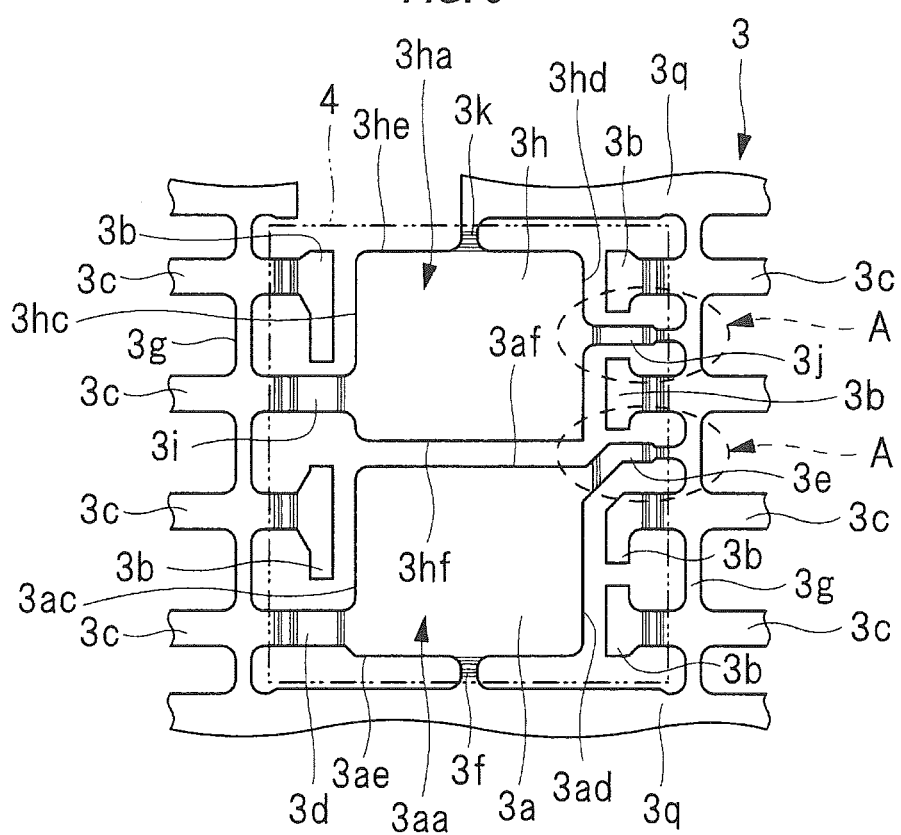
FIG. 8 is an enlarged partial plan view showing an example of a structure of a lead frame used in the assembling of the semiconductor device shown in FIG. 1.

Specifically, as shown in FIG. 8, the die pad 3a is supported by the first support pin 3d connected to the outer lead 3c, the second support pin 3e that is arranged between two inner leads 3b adjacent to each other and that is connected to the tie bar 3g, and the third support pin 3f connected to the frame portion 3q. In the same way, the die pad 3h is also supported by the first support pin 3i connected to the outer lead 3c, the second support pin 3j that is arranged between two inner leads 3b adjacent to each other and that is connected to the tie bar 3g, and the third support pin 3k connected to the frame portion 3q.

Note that the first support pin 3d, the second support pin 3e, and the third support pin 3f are integrally formed together with the die pad 3a. In contrast, the first support pin 3i, the second support pin 3j, and the third support pin 3k are integrally formed together with the die pad 3h.

In addition, the upper surface 3aa of the die pad 3a includes the first side 3ac, the second side 3ad, the third side 3ae and the fourth side 3af, and the first support pin 3d is coupled to the first side 3ac and the second support pin 3e is coupled to the second side 3ad connected to the first side 3ac. Furthermore, the third support pin 3f is connected to the third side 3ae different from both the first side 3ac to which the first support pin 3d is connected and the second side 3ad to which the second support pin 3e is connected.

In contrast, in the same manner as in the die pad 3a, the upper surface 3ha of the die pad 3h includes a first side 3hc, a second side 3hd, a third side 3he and a fourth side 3hf, and the first support pin 3i is connected to the first side 3hc and the second support pin 3j is connected to the second side 3hd opposite to the first side 3hc. Moreover, the third support pin 3k is connected to the third side 3he different from both the first side 3hc to which the first support pin 3i is connected and the second side 3hd to which the second support pin 3j is connected.

Note that no support pin is connected to the fourth side 3af of the die pad 3a and the fourth side 3hf of the die pad 3h, and the die pad 3a and the die pad 3h are arranged so that the fourth side 3af and the fourth side 3hf face each other.

Here, the lead frame 3 including the inner leads 3b, the outer leads 3c, the support pins, the die pads 3a and 3h, the tie bars 3g, the frame portion 3q, and the like is formed by a thin plate member formed of, for example, a copper alloy, an iron-nickel alloy, or the like.

As described above, in the lead frame 3 of the present embodiment, each of the two die pads 3a and 3h has a three-point support configuration by the three support pins, and as shown in an A portion in FIG. 8, each of the second support pins 3e and 3j included in the two pairs of the three support pins is arranged between two inner leads 3b adjacent to each other and coupled to the tie bar 3g. Furthermore, the two pairs of three support pins are integrally formed together with the die pads 3a and 3h respectively.

Here, a balance (degree of stability) of a support form of the two die pads 3a and 3h in the lead frame 3 of the present embodiment will be described with reference to FIG. 9. FIG. 9 shows balances between support positions of the die pads 3a and 3h, each of which is supported by three points, in the lead frame 3 of the present embodiment. In each of the die pads 3a and 3h, a triangle is formed by using the support positions as points, and whether or not the shape of the triangle is well-balanced (whether or not the shape of the triangle has an extremely sharp angle) is evaluated.

As shown in FIG. 9, the shape of the triangle of both the triangle A of the die pad 3a and the triangle B of the die pad 3h is well-balanced, and thus it can be found that the die pads 3a and 3h are in a support state of a high degree of stability.

After the provision of the lead frame, the die bonding shown in step S2 in FIGS. 4 and 5 is performed. In the die bonding process, first, the die bonding paste coating shown in S2-1 in FIG. 5 is performed. That is, the die pads 3a and 3h of the lead frame 3 are coated with a solder paste that is the die bonding paste 5. Furthermore, the chip mounting shown in S2-2 in FIG. 5 is performed.

Here, as shown in FIG. 3, the semiconductor chip 1 is mounted, via the die bonding paste 5, over the upper surface 3aa of the die pad 3a and the semiconductor chip 2 is mounted, via the die bonding paste 5, over an upper surface 3ha of the die pad 3h. Note that, as shown in FIG. 1, the electrode pads 1c are formed on the front surface 1a of the semiconductor chip 1 and the electrode pads 2c are formed on the front surface 2a of the semiconductor chip 2.

When the chips are mounted, a predetermined load is applied to the semiconductor chips 1 and 2. However, since each of the die pads 3a and 3h of the lead frame 3 of the present embodiment is supported with high stability at three points by the three support pins, it is possible to reduce the vertical movement (vibration) of the die pads 3a and 3h.

After the completion of the die bonding, the wire bonding shown in step S3 in FIGS. 4 and 6 is performed. In the wire bonding process, as shown in FIG. 1, the electrode pads 1c of the semiconductor chip 1 and the electrode pads 2c of the semiconductor chip 2 are electrically coupled, via the wires 6, to the inner leads 3b corresponding to each electrode pad.

Even at the time of the wire bonding, a predetermined load or an ultrasonic wave is applied to the semiconductor chips 1 and 2. However, since each of the die pads 3a and 3h of the lead frame 3 of the present embodiment is supported with high stability at three points by the three support pins, it is possible to reduce the vertical movement (vibration) of the die pads 3a and 3h at the time of the wire bonding.

After the completion of the wire bonding, the resin sealing (resin molding) shown in step S4 in FIGS. 4 and 6 is performed. That is, the support pins, the semiconductor chips 1 and 2, the die pads 3a and 3h, the inner leads 3b, and wires 6 are sealed by the sealing resin 8 shown in FIG. 6 and a sealing body 4 is formed.

At this time, the lead frame 3 to which the wires are bonded is arranged over a lower molding die 9a of a resin molding die 9 as a work piece, then the lead frame 3 is clamped by the lower molding die 9a and an upper molding die 9b, and furthermore, a resin sealing is performed by injecting the sealing resin 8 into a cavity 9c formed by the lower molding die 9a and the upper molding die 9b.

Even at the time of resin injection in the resin sealing process, a pressure due to the resin injection is applied to the semiconductor chips 1 and 2 and the die pads 3a and 3h. However, since each of the die pads 3a and 3h of the lead frame 3 of the present embodiment is supported with high stability at three points by the three support pins, it is possible to reduce the vertical movement (vibration) of the die pads 3a and 3h at the time of the resin injection.

After completion of the resin sealing, the post cure shown in step S5 in FIGS. 4 and 7 is performed. That is, the sealing body 4 formed in the resin sealing process and the like is heat-treated and cured.

After completion of the post cure, the deburring/external plating shown in step S6 in FIG. 4 is performed. That is, resin burrs and the like formed in the resin sealing process and the like are removed and external plating is applied to the outer leads 3c and the like.

After completion of the deburring/external plating, the package separation/lead trim and form shown in step S7 in FIGS. 4 and 7 is performed. That is, as shown in FIG. 7, each of the outer leads 3c is cut off and separated from the lead frame 3 and each outer lead 3c is bent and formed. In the present embodiment, each outer lead 3c is bent and formed into a gull-wing shape.

In the package separation process, as shown in FIG. 10, first, the tie bars 3g between the outer leads 3c adjacent to each other are cut off by a tie bar cut punch 10 (A portion), and at the same time, the second support pins 3e and 3j are cut off by the tie bar cut punch 10 (B portion and C portion).

Namely, since both the second support pins 3e and 3j are connected to the tie bars 3g, both the second support pins 3e and 3j can be cut off by the tie bar cut punch 10 together with the tie bars 3g. That is, both the second support pins 3e and 3j can be easily cut off without being left in the tie bar cut process.

After the package separation/lead trim and form, the characteristic screening shown in step S8 in FIG. 4 is performed. That is, an electrical characteristic test is performed on the assembled SOP 7 and defective or non-defective product is determined.

After the characteristic screening, the marking shown in step S9 is performed on the SOP 7 which is determined to be a non-defective product. Here, for example, information such as a model number or the like of the product is marked on the front surface of the sealing body 4.

After the marking, the taping shown in step S10 in FIG. 4 is performed and further the packing/shipping shown in step S11 is performed.

According to the manufacturing method of a semiconductor device and the semiconductor device of the present embodiment, two pairs of the three support pins supporting the die pads 3a and 3h include the first support pins 3d and 3i, the second support pins 3e and 3j, and the third support pins 3f and 3k, and furthermore each of the first support pins 3d and 3i, the second support pins 3e and 3j, and the third support pins 3f and 3k is integrally formed together with each of the two die pads 3a and 3h. Thereby, each of the die pads 3a and 3h is supported at three points, and thus it is possible to reduce the vertical movement (vibration) of each of the die pads 3a and 3h in the assembling process.

That is, each of the die pads 3a and 3h is supported in a balanced manner at three points, and thus it is possible to reduce the vertical movement (vibration) of each of the die pads 3a and 3h in the die bonding process, the wire bonding process and the like. Thereby, a sufficient load for bonding can be applied, and thus it is possible to suppress the occurrence of a bonding failure.

Since the die pads are supported in a balanced manner at three points, it is possible to reduce the vertical movement (vibration) of the die pads at the time of the resin injection in the resin sealing process. As a result, at the time of the resin injection, it is possible to reduce damage done to the semiconductor chips and the wires, and thus it is possible to suppress the occurrence of a defect such as a broken wire.

As a result, it is possible to enhance the reliability of the semiconductor device.

By arrangement of each of the second support pins 3e and 3j between the inner leads, it is possible to increase the number of pins of the semiconductor device without changing the size (appearance size) of the semiconductor device main body, and thus functional enhancement of the semiconductor device can also be addressed. That is, by connecting, to the tie bar 3g, each of the second support pins 3e and 3j arranged between the inner leads 3b, it is possible to support the die pads 3a and 3h without using signal pins.

Thereby, it is possible to increase the number of signal pins, and thus the function of the semiconductor device can be enhanced.

Furthermore, by arrangement of each of the second support pins 3e and 3j between the inner leads 3b, it is possible to ensure a distance between the inner leads 3b adjacent to each other, and thus it is possible to prevent migration generated between the inner leads 3b.

Note that, when the semiconductor device is a small semiconductor device, an area for performing the wire bonding is required in a second bonding portion (stitch bonding portion) of the inner leads 3b, and thus it is not possible to bring the outer peripheries of the die pads 3a and 3h close to the outer periphery of the sealing body 4. That is, it is not possible to form each of the die pads 3a and 3h to be much larger than the semiconductor chips 1 and 2. Therefore, in the case of a frame structure in which the support pins and the die pads are formed as different parts and thereafter they are coupled to each other, a coupling portion to the support pins is required to be provided in the die pads. However, it is not possible to form the die pads to be much larger than the semiconductor chips 1 and 2, and as a result, there is no space to provide the coupling portion in the die pads, thereby it being difficult to employ the above frame structure.

However, in the semiconductor device of the present embodiment, two pairs of three support pins are integrally formed together with the die pads 3a and 3h respectively, and thus the coupling portion is not required to be provided. Therefore, the size of the die pads 3a and 3h can be as small as the chip size. As a result, it is possible to address the reduction of the size of the semiconductor device (SOP 7).

Furthermore, in the frame structure in which the support pins and the die pads are formed as different parts, the lead frame is formed of two types of materials. Therefore, the cost is high and a processing cost of coupling the support pins and the die pads to each other is also required, and thus the cost of the semiconductor device further increases.

Moreover, also in ensuring the coupling accuracy at the time of coupling the support pins and the die pads to each other, the size of the die pads needs to be much larger than the chip size, and thus the above frame structure cannot be applied to a small semiconductor device.

Next, modifications of the present embodiment will be described.

Figure 11:
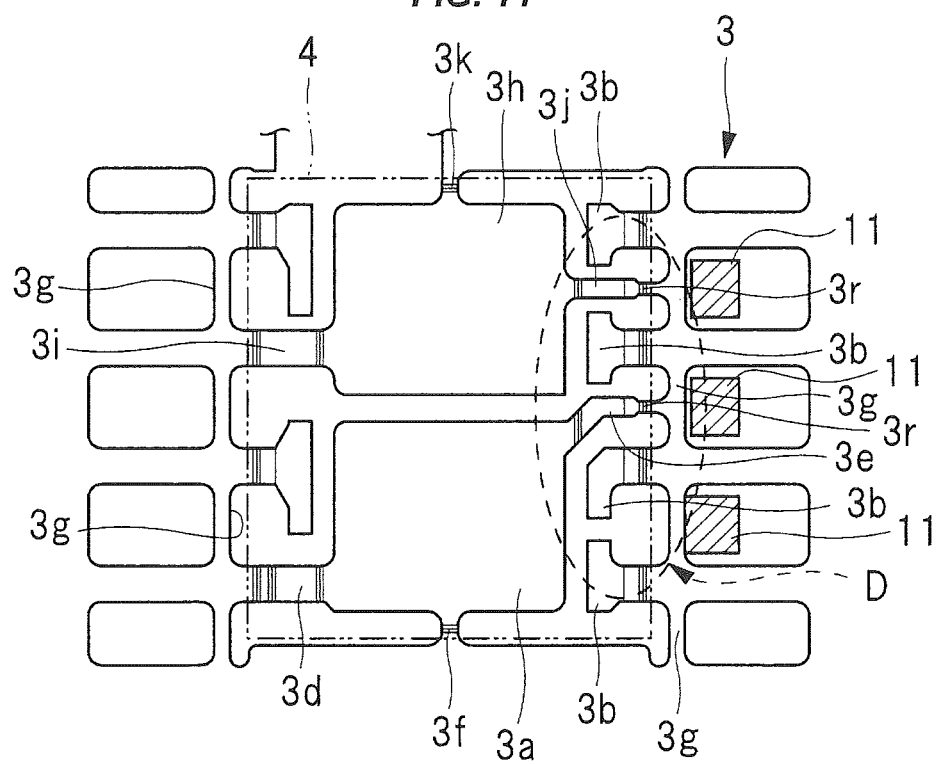
FIG. 11 is a partial plan view showing a first modification of the separation method of the second support pins (before injecting a resin) in the assembling of the semiconductor device shown in FIG. 1.
Figure 12:
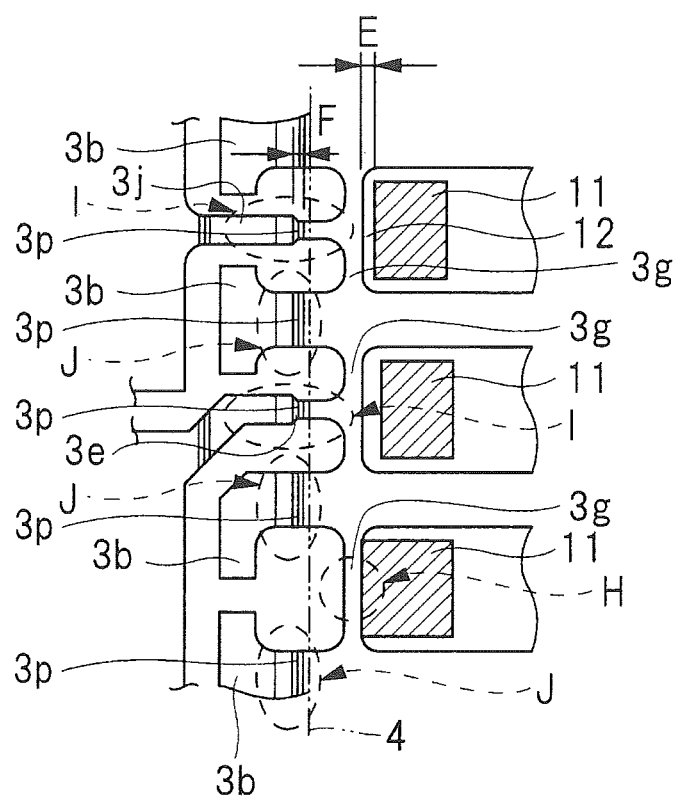
FIG. 12 is an enlarged partial plan view showing a structure of a D portion in FIG. 11.
Figure 13:
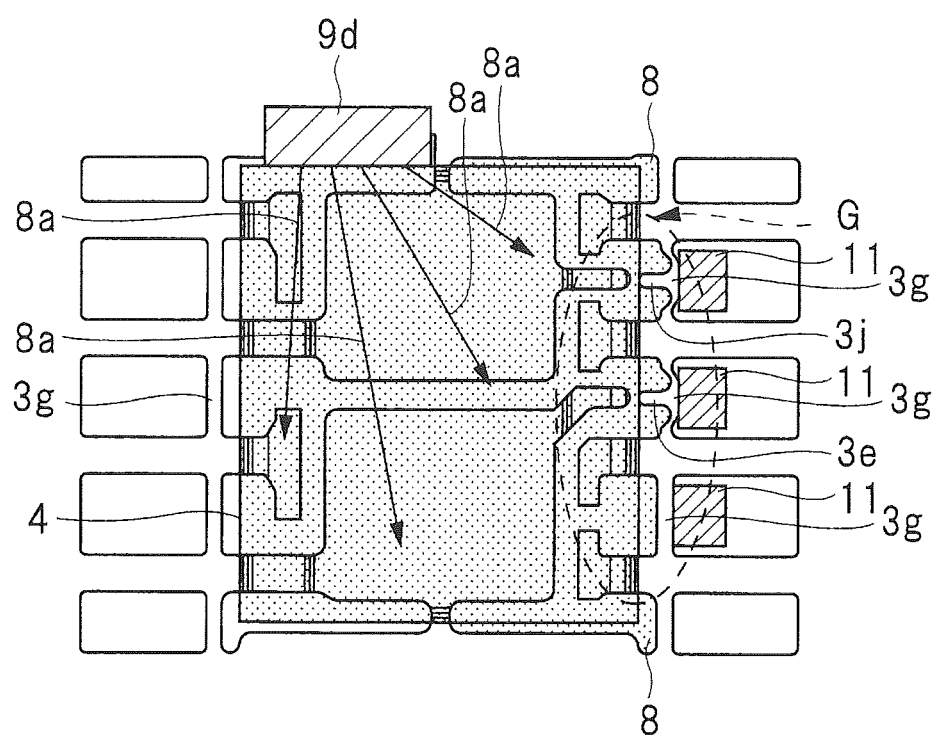
FIG. 13 is a partial plan view showing the first modification of the separation method of the second support pins (after injecting a resin) in the assembling of the semiconductor device shown in FIG. 1.
Figure 14:
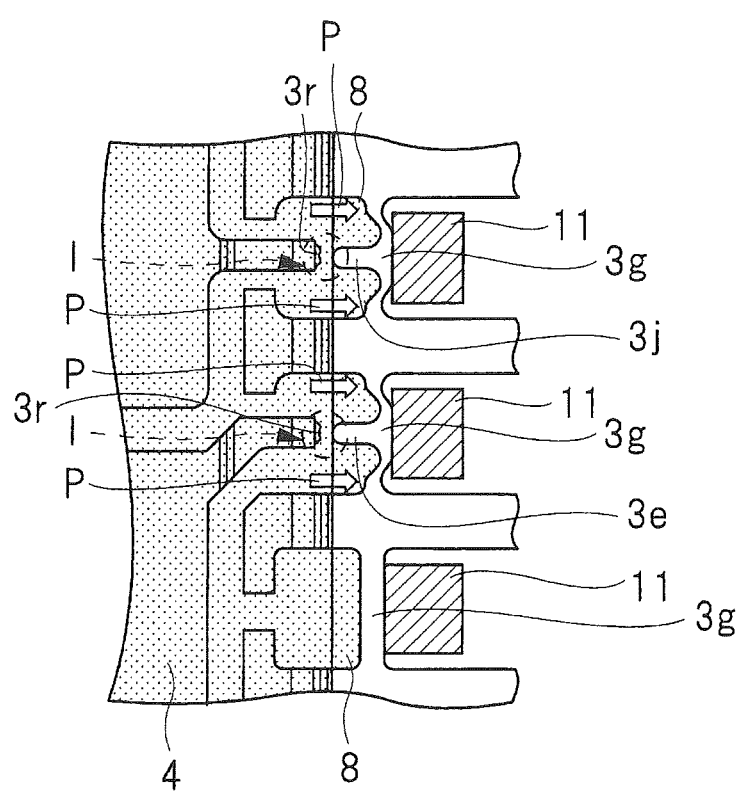
FIG. 14 is an enlarged partial plan view showing a structure of a G portion in FIG. 13.
Figure 15:
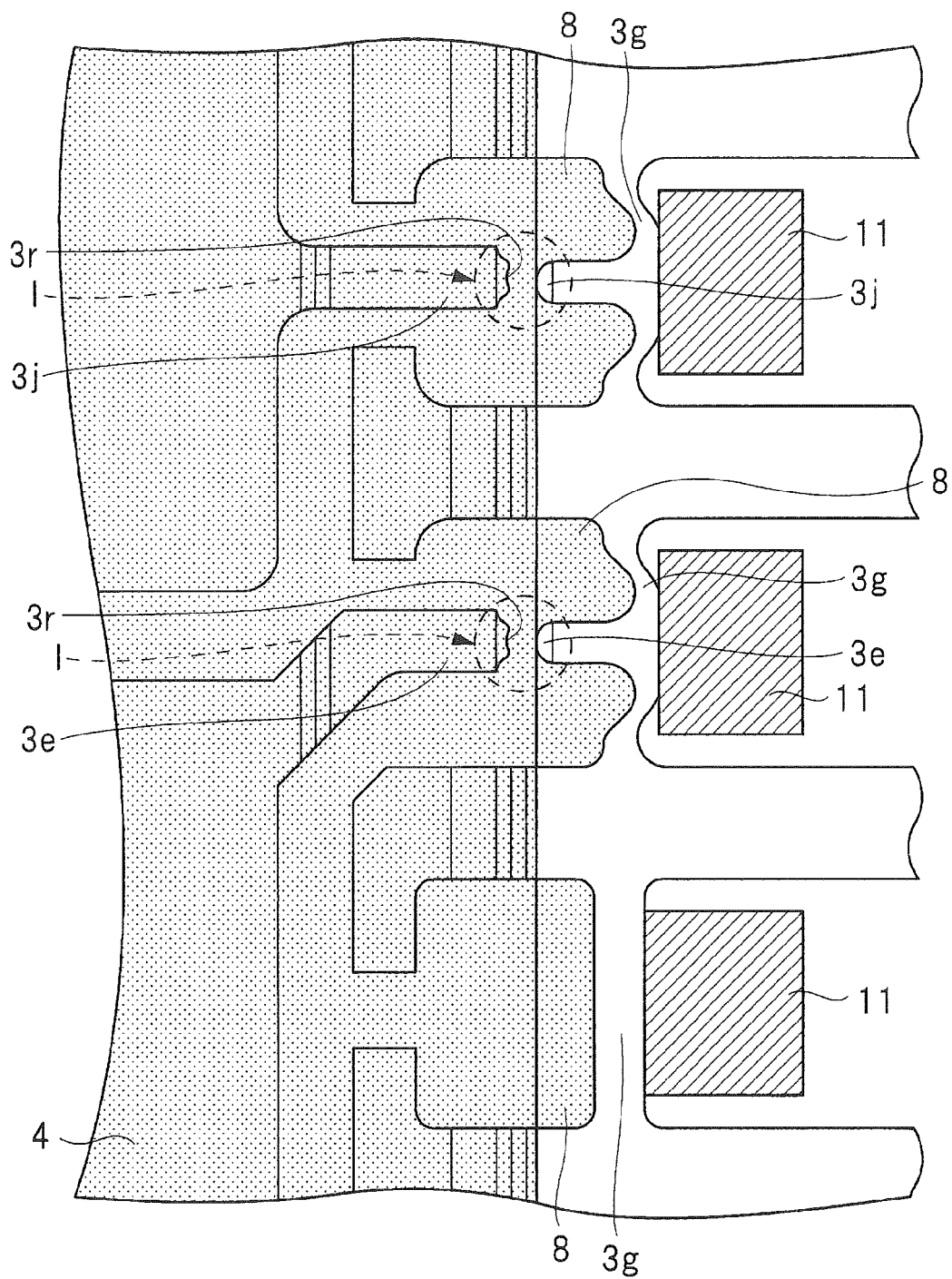
FIG. 15 is an enlarged partial plan view showing a detailed structure of FIG. 14.

FIG. 11 is a partial plan view showing a first modification of the separation method of the second support pins (before injecting a resin) in the assembling of the semiconductor device shown in FIG. 1. FIG. 12 is an enlarged partial plan view showing a structure of a D portion in FIG. 11. FIG. 13 is a partial plan view showing the first modification of the separation method of the second support pins (after injecting a resin) in the assembling of the semiconductor device shown in FIG. 1. FIG. 14 is an enlarged partial plan view showing a structure of a G portion in FIG. 13. FIG. 15 is an enlarged partial plan view showing a detailed structure of FIG. 14.

The first modification shown in FIGS. 11 to 15 shows a modification of the separation method of the second support pins 3e and 3j arranged between the inner leads 3b adjacent to each other, the first modification is different from the method of cutting off the support pins together with the tie bars 3g in the tie bar cut process after the resin sealing as shown in FIG. 10, and the first modification is a method of separating the support pins by tearing off the support pins by an injecting pressure of a resin in the resin sealing process. That is, in the resin sealing process, the inside of the tie bars 3g is filled with the sealing resin 8 shown in FIG. 13, and thus the pressure of the sealing resin 8, acting on the tie bars 3g is used. The tie bars 3g are pressed and deformed by the pressure of the sealing resin 8 when the resin is injected, and the second support pins 3e and 3j connected to the tie bars 3g are torn off by the deformation of the tie bars 3g.

Specifically, first, as shown in FIGS. 11 and 12, before the sealing resin 8 of FIG. 13 is injected into the resin molding die 9 in FIG. 6, block members 11 are arranged outside the tie bars 3g with a clearance 12 of a distance E from the tie bar 3g being provided between them. At this time, as shown in FIG. 12, when an allowable amount of deformation of the tie bar 3g deformed by the pressure of the sealing resin 8 is defined as E, the amount of deformation of the tie bar 3g can be set by the distance E of the clearance 12 between the block member 11 and the tie bar 3g.

In addition, by the distance E being set to be equal to or greater than a distance F between a torn-off portion 3r in FIG. 11 of the second support pins 3e and 3j and the outer periphery of the sealing body 4 in FIG. 12 (the contour of the mold) formed by the resin sealing (E>=F), the support pins can be torn off inside the outer periphery of the sealing body 4.

Furthermore, since the maximum amount of deformation of the tie bar 3g is the distance E, it is possible to prevent the deformation of the tie bar 3g from being greater than necessary.

Note that, as shown in an H portion in FIG. 12, the tie bar 3g to which no support pin is connected need not be deformed, and thus the block member 11 is arranged at a position slightly in contact with the tie bar 3g without providing a clearance from the tie bar 3g.

Furthermore, as shown in portions I in FIG. 12, it is preferable that there is formed a groove portion 3p (for example, V-groove), a step portion, or a notch in the torn-off portion 3r shown in FIG. 11 near the tip of the second support pins 3e and 3j so that the cross-section area of the torn-off portion 3r is reduced. By the groove portion 3p, the step portion, or the notch being formed in the torn off portion 3r near the tip of the second support pins 3e and 3j, the support pins can be easily torn off and the stress applied to the support pins 3e and 3j can be reduced, when the second support pins 3e and 3j are torn off.

It is preferable that the torn-off portions 3r of the second support pins 3e and 3j are formed at positions inside the outer periphery of the sealing body 4 to be formed. Thereby, it is possible to seal the second support pins 3e and 3j including the tips thereof inside the sealing body 4.

Furthermore, the timing when the deformation of the tie bars 3g and the fracture (tearing off) of the second support pins 3e and 3j occur is, as shown in FIGS. 13 and 14, the final stage of the resin sealing process after the sealing resin 8 is injected via a gate 9d of the resin molding die 9 (see FIG. 6) and a resin flow 8a fills the inside of the resin molding die 9, that is, the timing when the filling of the sealing resin 8 is substantially completed and a set final pressure is applied. At this time, the sealing resin 8 is a fluid that has not yet cured, a pressure P of the sealing resin 8 is applied to the tie bars 3g as shown in FIG. 14, the tie bars 3g are deformed by the pressure P as shown in areas around portions I in FIG. 14, and the second support pins 3e and 3j are torn off at the torn-off portions 3r thereof by the deforming force of the tie bars 3g, as shown in portions I in FIG. 15.

Note that the second support pins 3e and 3j are fractured and the sealing resin 8 flows into a gap between the fractured support pins, but the amount of the sealing resin 8 that flows into the gap is extremely small compared with the volume of the sealing body 4, and thus the die pads 3a and 3h do not vibrate (shift) vertically and are not deformed even though the holding forces of the die pads 3a and 3h are lost due to the fracture of the support pins.

After the second support pins 3e and 3j are torn off, the tips of the second support pins 3e and 3j are covered by the sealing resin 8. That is, the gaps between the second support pins 3e and 3j fractured inside and the outer periphery of the sealing body 4 (the gaps between the torn-off pins shown in the portions I in FIG. 15) are filled with the sealing resin 8, and thus the torn-off tips of the second support pins 3e and 3j are brought into a state of being buried in the sealing body 4.

After completion of the sealing, the second support pins 3e and 3j that are torn off at the torn-off portions 3r are buried in the sealing body 4 and cannot be seen from outside, and thus the appearance of the SOP 7 is not damaged.

In addition, it is possible to prevent the degradation of the humidity resistance due to penetration of liquid from the outside of the sealing body 4, prevent the degradation of the insulation resistance, and prevent the generation of the migration between a support pin and a lead adjacent to the support pin, and thus the reliability of the SOP 7 can be enhanced.

Furthermore, after the second support pins 3e and 3j are torn off by the deformations of the tie bars 3g, the deformations of the tie bars 3g hit the block members 11 and stop, and thus the tie bars 3g are not deformed any more, so that it is possible to prevent the respective inner leads 3b connected to the tie bars 3g from being deformed.

Note that, as shown in J portions in FIG. 12, the groove portion 3p such as a V-groove, a step portion or the like are formed at positions located inside the outer periphery of the sealing body 4 of the respective inner leads 3b, and thus it is possible to prevent the degradation of the humidity resistance, the degradation of the insulation resistance and the like due to penetration of liquid from the outside, and to enhance the reliability of the SOP 7.

Next, the second to the fourth modifications will be described.

Figure 16:
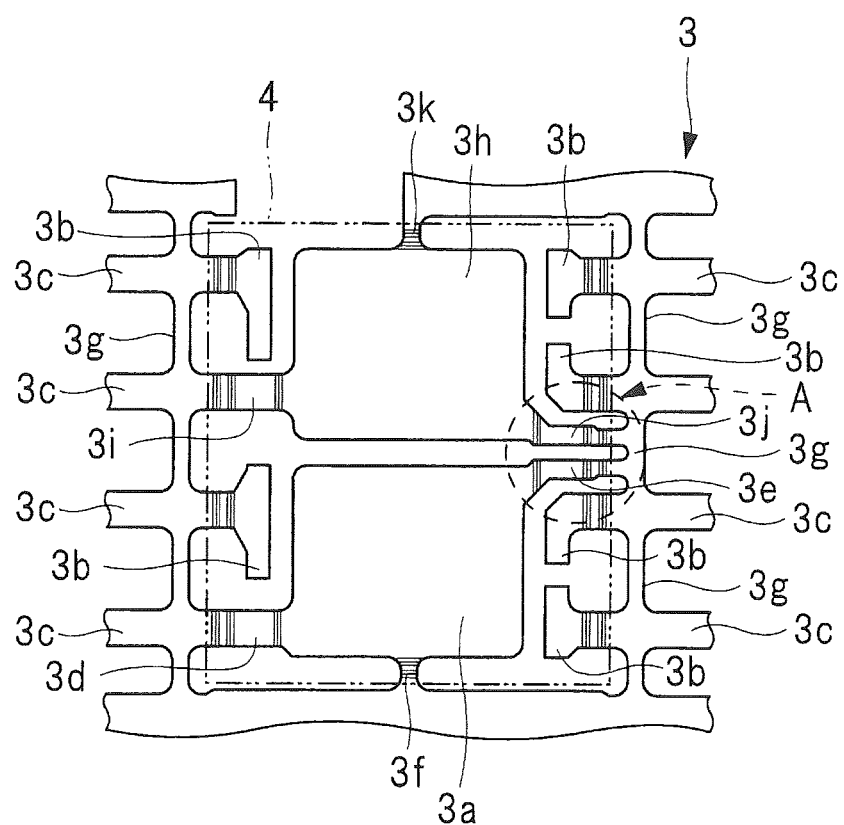
FIG. 16 is an enlarged partial plan view showing a structure of a lead frame of a second modification used in the assembling of the semiconductor device of the embodiment.
Figure 17:
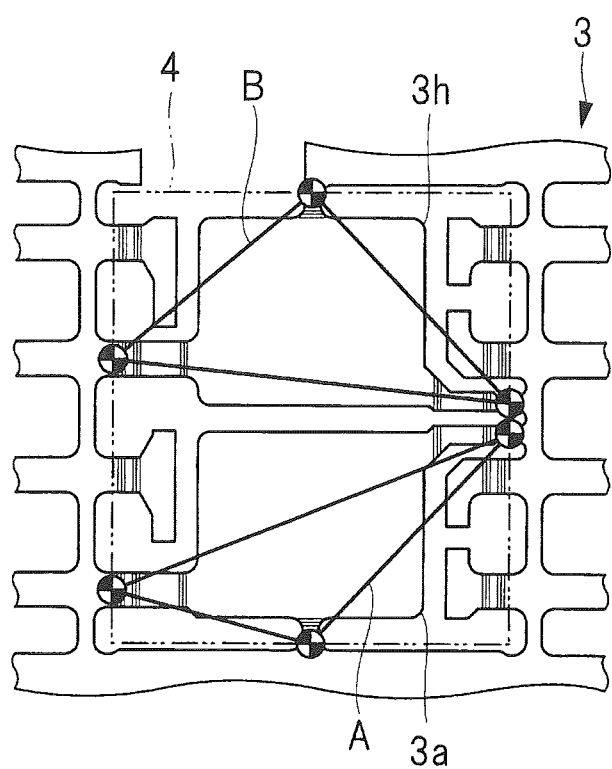
FIG. 17 is a partial plan view showing stability of die pads of the lead frame shown in FIG. 16.
Figure 18:
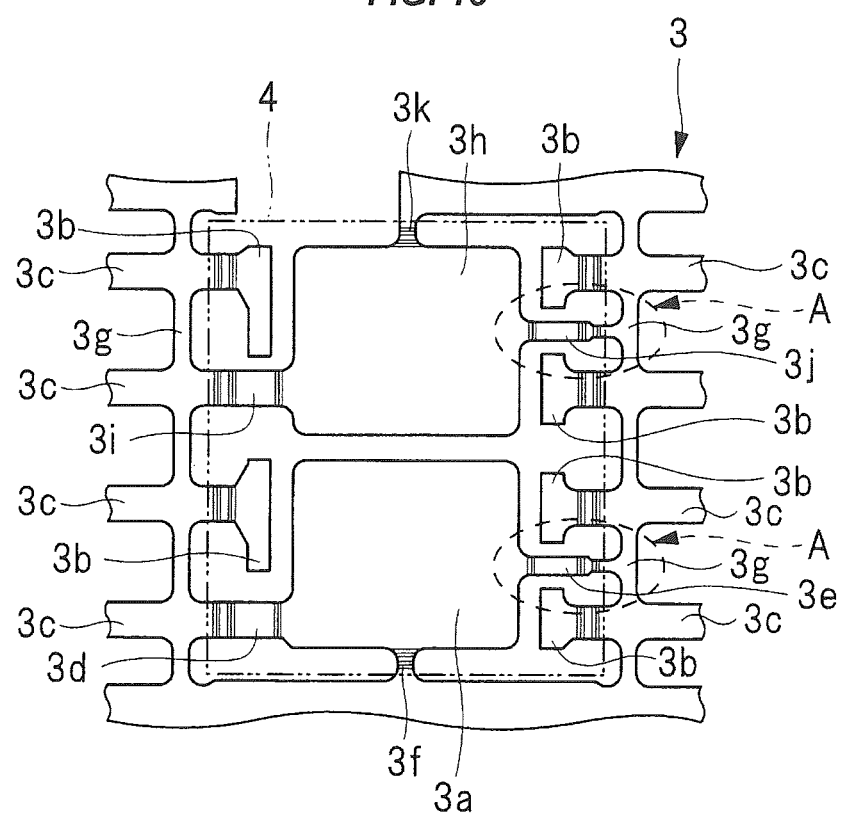
FIG. 18 is an enlarged partial plan view showing a structure of a lead frame of a third modification used in the assembling of the semiconductor device of the embodiment.
Figure 19:
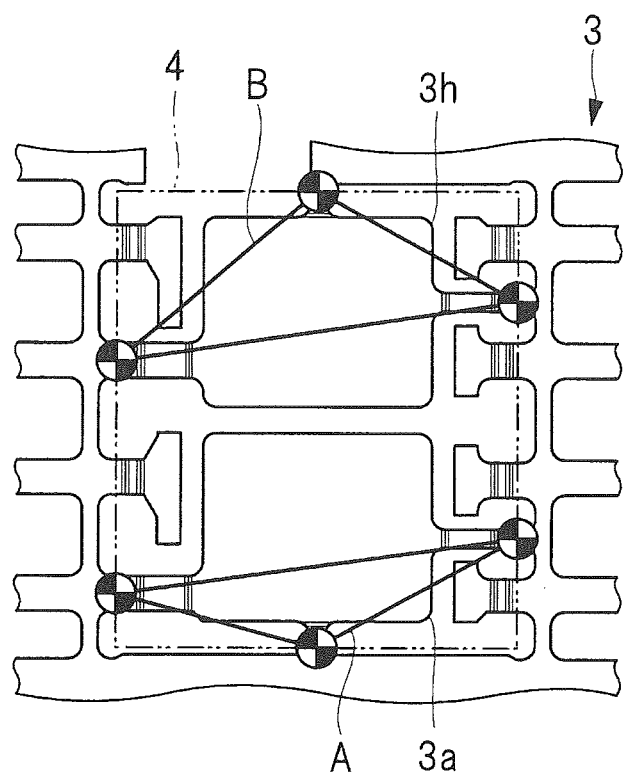
FIG. 19 is a partial plan view showing stability of die pads of the lead frame shown in FIG. 18.
Figure 20:
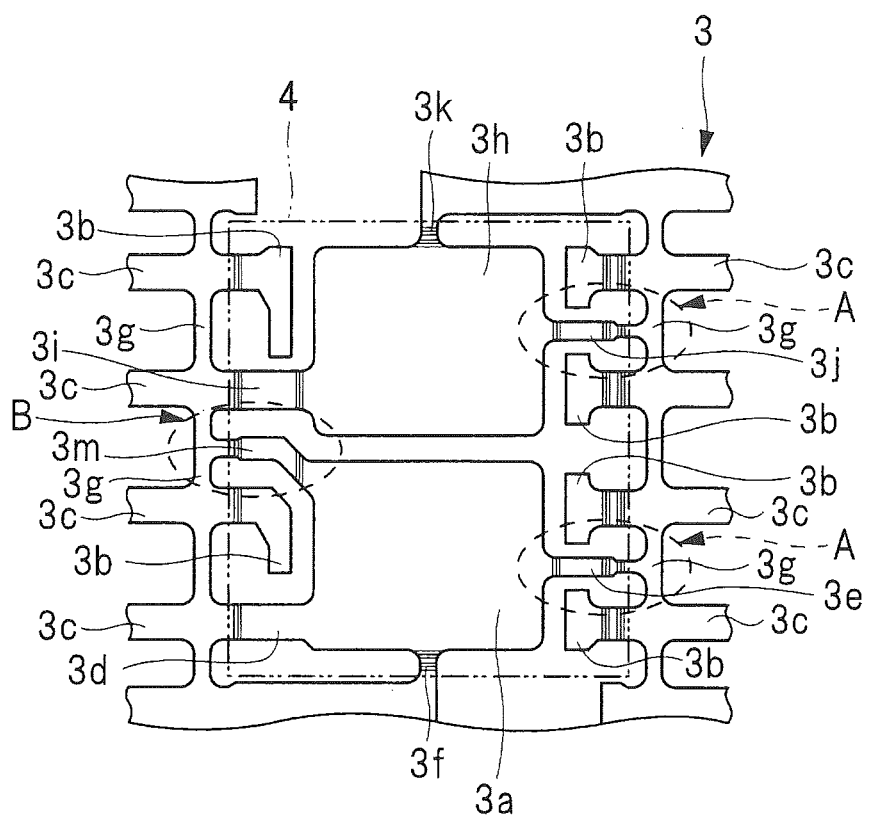
FIG. 20 is an enlarged partial plan view showing a structure of a lead frame of a fourth modification used in the assembling of the semiconductor device of the embodiment.
Figure 21:
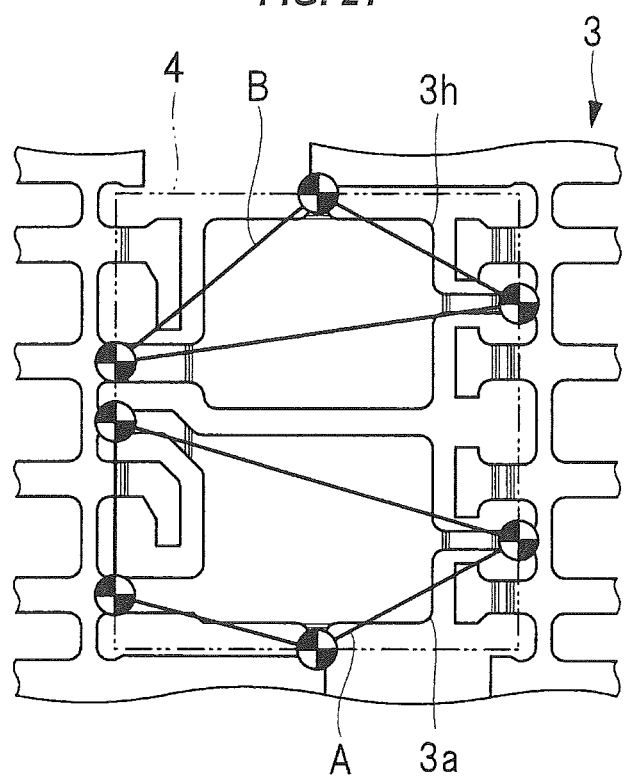
FIG. 21 is a partial plan view showing stability of die pads of the lead frame shown in FIG. 20.

FIG. 16 is an enlarged partial plan view showing a structure of a lead frame of the second modification used in the assembling of the semiconductor device of the embodiment. FIG. 17 is a partial plan view showing stability of die pads of the lead frame shown in FIG. 16, and FIG. 18 is an enlarged partial plan view showing a structure of a lead frame of the third modification used in the assembling of the semiconductor device of the embodiment. Moreover, FIG. 19 is a partial plan view showing stability of die pads of the lead frame shown in FIG. 18, FIG. 20 is an enlarged partial plan view showing a structure of a lead frame of the fourth modification used in the assembling of the semiconductor device of the embodiment, and FIG. 21 is a partial plan view showing stability of die pads of the lead frame shown in FIG. 20.

In the second modification shown in FIGS. 16 and 17, in the lead frame 3 in which two die pads 3a and 3h are provided side by side, two second support pins 3e and 3j connected to each of the two die pads 3a and 3h are arranged adjacent to each other as shown in an A portion in FIG. 16 and both die pads 3a and 3h are pads each having a three-point support configuration of being supported at three points by three support pins.

Furthermore, the second support pins 3e and 3j of each of the three support pins are connected to a tie bar 3g.

Also in the lead frame 3 of the second modification shown in FIGS. 16 and 17, as shown in FIG. 17, the triangular shapes of both the triangle A of the die pad 3a and the triangle B of the die pad 3h are well-balanced, and thus it can be found that the die pads 3a and 3h are in a support state of a high degree of stability.

In addition, in the third modification shown in FIGS. 18 and 19, in the lead frame 3 in which two die pads 3a and 3h are provided side by side, two second support pins 3e and 3j connected to each of the two die pads 3a and 3h are arranged between inner leads 3b adjacent to each other as shown in portions A in FIG. 18 and each of the second support pins 3e and 3j is connected to a tie bar 3g.

Therefore, both die pads 3a and 3h have three-point support configurations of being supported by three support pins.

Also in the lead frame 3 of the third modification shown in FIGS. 18 and 19, as shown in FIG. 19, the triangular shapes of both the triangle A of the die pad 3a and the triangle B of the die pad 3h are well-balanced, and thus it can be found that the die pads 3a and 3h are in a support state of a high degree of stability.

In addition, in the fourth modification shown in FIGS. 20 and 21, in the lead frame 3 in which two die pads 3a and 3h are provided side by side, each of two second support pins 3e and 3j connected to the two die pads 3a and 3h, respectively, is arranged between inner leads 3b and connected to a tie bar 3g, as shown in portions A in FIG. 20. Furthermore, one die pad 3a is also supported by a fourth support pin 3m shown in a B portion in FIG. 20, which is connected to a tie bar 3g.

That is, the die pad 3a has a four-point support configuration of being supported by four support pins and the die pad 3h has a three-point support configuration of being supported by three support pins.

The lead frame 3 of the fourth modification shown in FIGS. 20 and 21 also includes the die pad 3a having a four-point support configuration and the die pad 3h having a three-point support configuration, and as shown in FIG. 21, the quadrangular and triangular shapes of the quadrangle A of the die pad 3a and the triangle B of the die pad 3h, respectively, are well-balanced, and thus it can be found that the die pads 3a and 3h are in a support state of a high degree of stability.

Also in the SOP 7 assembled by using the lead frame 3 of the second to the fourth modifications described above, it is possible to obtain the same effects as those obtained by the SOP 7 shown in FIGS. 1 to 3 and by the assembling of the SOP 7.

Next, the fifth to the seventh modifications will be described.

Figure 22:
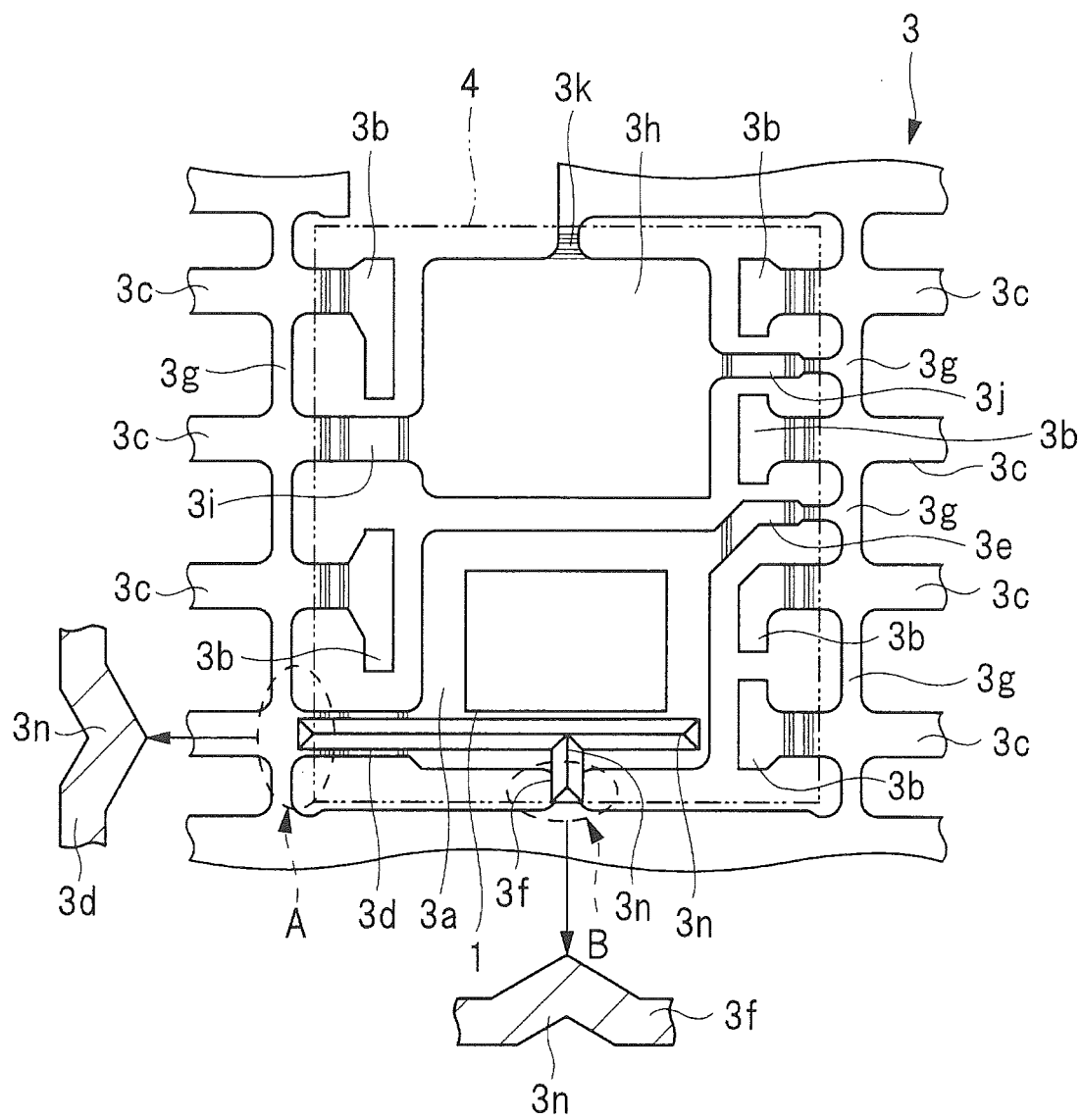
FIG. 22 is an enlarged partial plan view and partial cross-sectional views showing a structure of a lead frame of a fifth modification used in the assembling of the semiconductor device of the embodiment.
Figure 23:
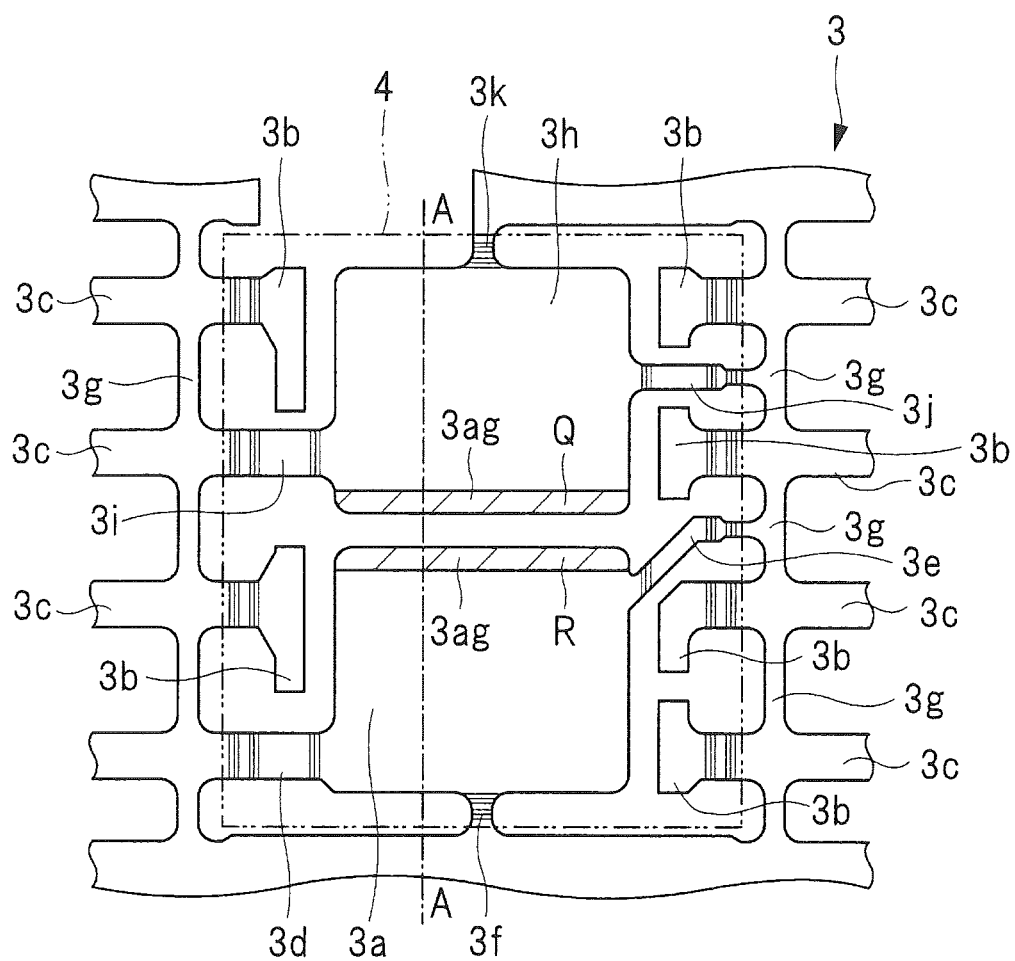
FIG. 23 is an enlarged partial plan view showing a structure of a lead frame of a sixth modification used in the assembling of the semiconductor device of the embodiment.
Figure 24:
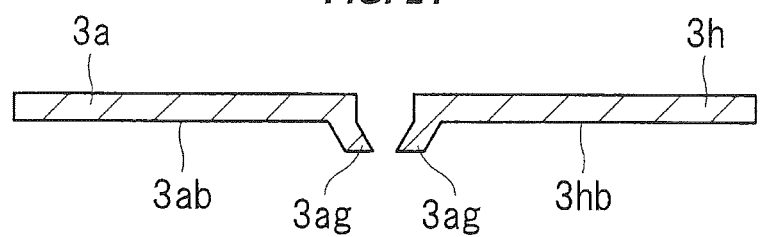
FIG. 24 is a cross-sectional view showing a structure taken along A-A line in FIG. 23.
Figure 25:
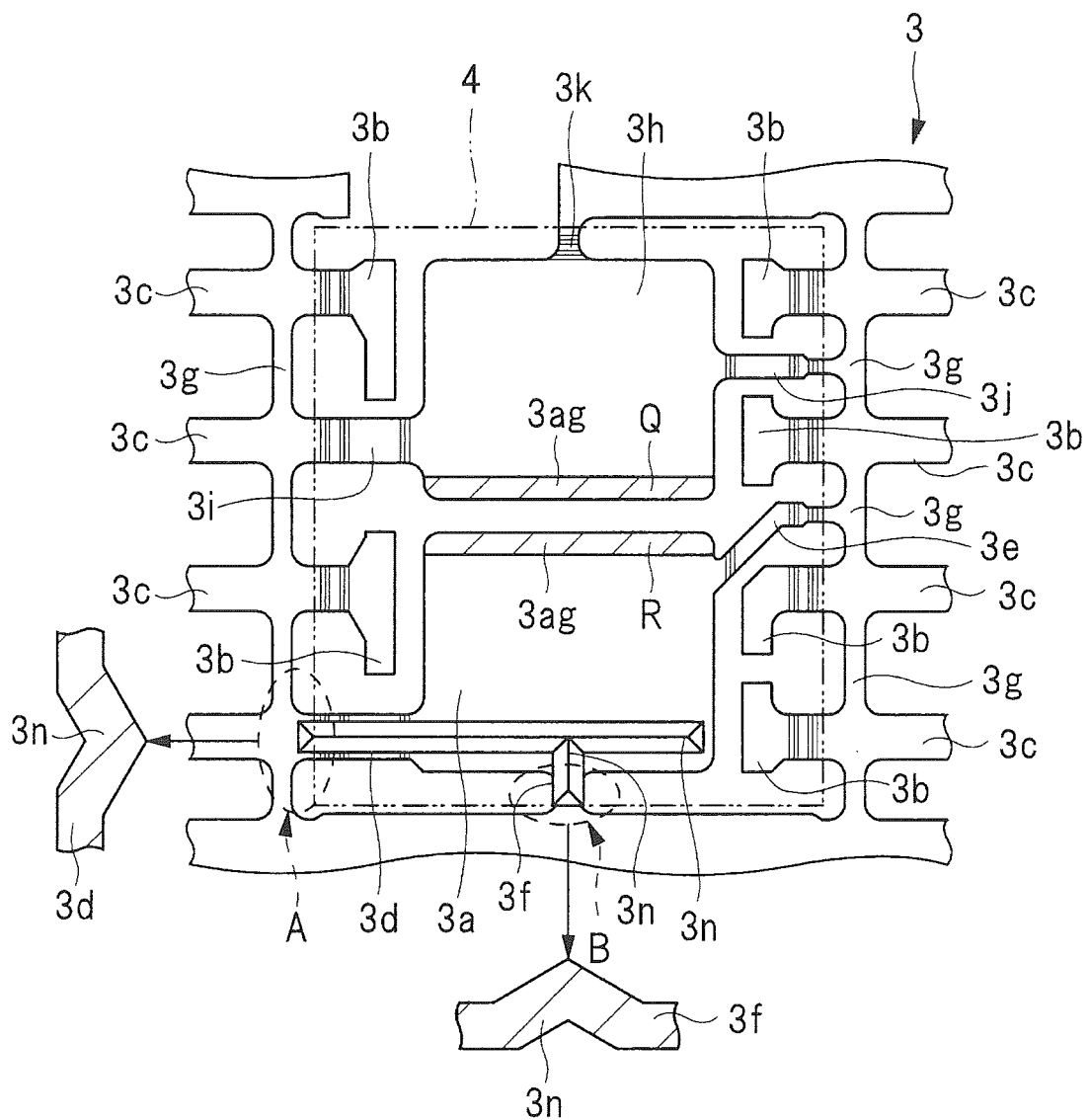
FIG. 25 is an enlarged partial plan view and partial cross-sectional views showing a structure of a lead frame of a seventh modification used in the assembling of the semiconductor device of the embodiment.

FIG. 22 is an enlarged partial plan view and partial cross-sectional views showing a structure of a lead frame of the fifth modification used in the assembling of the semiconductor device of the embodiment. FIG. 23 is an enlarged partial plan view showing a structure of a lead frame of the sixth modification used in the assembling of the semiconductor device of the embodiment. FIG. 24 is a cross-sectional view showing a structure taken along A-A line in FIG. 23. In addition, FIG. 25 is an enlarged partial plan view and partial cross-sectional views showing a structure of a lead frame of the seventh modification used in the assembling of the semiconductor device of the embodiment.

The fifth modification shown in FIG. 22 is a lead frame 3 having a shape in which two die pads 3a and 3h are provided side by side and each of two second support pins 3e and 3j connected to the two die pads 3a and 3h respectively is arranged between inner leads 3b and is connected to a tie bar 3g in the same manner as the die pads 3a and 3h of the lead frame 3 shown in FIG. 8.

Furthermore, in one die pad 3a, bent portions 3n are formed in some of the support pins (here, the first support pin 3d and the third support pin 3f) that support the die pad 3a and in an edge portion of the die pad 3a.

That is, as shown in an A portion and a B portion in FIG. 22, the bent portion 3n is formed in the first support pin 3d and the third support pin 3f along the extending direction of the support pins, and another bent portion 3n connected to the above bent portions 3n is formed in a part of edge portion (end portion) of the die pad 3a. Note that the bent portions 3n may be formed so that the cross-section of the support pins has an inverted V-shape as shown in the A portion and the B portion or may be formed so that the cross-section has a V-shape.

By the formation of the bent portions 3n in the edge portion (end portion) of the die pad 3a and the support pins, it is possible to reduce the vertical movement (vibration) of the die pad 3a in the die bonding process, the wire bonding process, and the like.

Moreover, the shapes of contact surfaces of the lower molding die 9a and the upper molding die 9b of the resin molding die 9 shown in FIG. 6 when the resin sealing is performed are caused to correspond to the shapes of the bent portions 3n of the support pins, and thus it is possible to reduce the vertical movement (vibration) of the die pad when the resin is injected in the resin sealing process. As a result, the reliability of the semiconductor device can be enhanced.

Note that the bent portions 3n in the edge portion (end portion) of the die pad and in the support pins may be formed in any one of the die pads or any one of the support pins, or may be formed in the die pads or the support pins.

Next, in the same manner as the die pads 3a and 3h of the lead frame 3 shown in FIG. 8, the sixth modification shown in FIGS. 23 and 24 is a lead frame 3 having a shape in which two die pads 3a and 3h are provided side by side and each of two second support pins 3e and 3j connected to the two die pads 3a and 3h respectively is arranged between inner leads 3b and is connected to a tie bar 3g.

In the lead frame 3 of the sixth modification, as shown in a Q portion and an R portion in FIG. 23, a folded portion 3ag is formed in at least one edge portion (end portion) corresponding to one of four sides of each of the die pads 3a and 3h. Here, as shown in FIG. 24, the folded portions 3ag are formed to be folded toward the lower surfaces 3ab and 3hb.

In this way, by the formation of the folded portions 3*ag* so as to be folded toward the lower surfaces 3*ab* and 3*hb*, the mounting of the semiconductor chips 1 and 2 cannot be prevented.

Note that the folded portion 3*ag* may be formed corresponding to at least any side of one die pad of the die pads.

As described above, by the formation of the folded portions 3*ag* in the die pad 3*a* and the die pad 3*h*, it is possible to enhance the rigidity of the die pads 3*a* and 3*h* themselves. As a result, it is possible to reduce the vertical movement (vibration) of each of the die pads 3*a* and 3*h* in the die bonding process, the wire bonding process, and further, the resin sealing process. Accordingly, the reliability of the semiconductor device can be enhanced.

Furthermore, in the same manner as the die pads 3*a* and 3*h* of the lead frame 3 shown in FIG. 8, the seventh modification shown in FIG. 25 is a lead frame 3 having a shape in which two die pads 3*a* and 3*h* are provided side by side and each of two second support pins 3*e* and 3*j* connected to the two die pads 3*a* and 3*h* respectively is arranged between inner leads 3*b* and is connected to a tie bar 3*g*.

Moreover, the shape of the lead frame 3 in FIG. 25 is a combined shape of the bent portions 3*n* (A portion and B portion) in the support pins and the edge portion (end portion) of the die pad in FIG. 22, and the folded portions 3*ag* (Q portion and R portion) in another edge portion (another end portion) of the die pads in FIG. 23.

Thereby, the rigidity of the die pads themselves can be enhanced, and at the same time, the rigidity of the support pins can also be enhanced.

As a result, it is possible to reduce the vertical movement (vibration) of the die pad 3*a* in the die bonding process, the wire bonding process, and the like. Furthermore, the shapes of the contact surfaces of the lower molding die 9*a* and the upper molding die 9*b* of the resin molding die 9 shown in FIG. 6 when the resin sealing is performed are caused to correspond to the shapes of the bent portions 3*n* of the support pins, and thus it is possible to reduce the vertical movement (vibration) of the die pad when the resin is injected in the resin sealing process.

As a result, it is possible to enhance the reliability of the semiconductor device.

Note that the folded portion 3*ag* and the bent portion 3*n* in the edge portion (end portion) of the die pad and the bent portion 3*n* in the support pin may be formed in any one of the die pads or any one of the support pins, or may be formed in the die pads or the support pins.

Although the invention made by the inventors has been specifically described on the basis of the embodiment, it is needless to say that the present invention is not limited to the foregoing embodiment, and can be variously modified within the scope not departing from the gist of the invention.

For example, in the embodiment described above, while the SOP is taken up and described as an example of the semiconductor device, the semiconductor device may be other semiconductor devices if the semiconductor devices include the die pads and the support pins that support the die pads. That is, the semiconductor device may be a discrete device other than SOP, and further, may be a semiconductor device such as QFN (Quad Flat Non-leaded Package) or QFP (Quad Flat Package).

What is claimed is:

1. A manufacturing method of a semiconductor device, the method comprising the steps of:
   (a) providing a lead frame including a plurality of die pads, an upper surface of which forms a rectangular shape in plan view, a plurality of support pins that support each of the die pads, a plurality of inner leads arranged around the die pads, a plurality of outer leads connected to each of the inner leads, and a tie bar that couples the outer leads to each other;
   (b) after step (a), mounting, over the upper surfaces of the die pads, a semiconductor chip including a main surface, a plurality of electrode pads formed in the main surface, and a back surface opposite to the main surface;
   (c) after step (b), electrically coupling, via a plurality of wires, the electrode pads of the semiconductor chip to the inner leads, respectively; and
   (d) after step (c), forming a sealing body that seals the support pins, the inner leads, the semiconductor chip, and the wires,
   wherein each of the die pads is arranged side by side,
   the support pins include a first support pin connected to the outer lead, a second support pin that is arranged between two of the inner leads and that is connected to the tie bar, and a third support pin connected to a side of the die pad different from sides to which the first support pin and the second support pin are connected, respectively, and
   wherein the first, the second, and the third support pins are integrally formed together with each of the die pads.

2. The manufacturing method of a semiconductor device according to claim 1,
   wherein, after step (d), when cutting off the tie bar, the second support pin is cut off concurrently.

3. The manufacturing method of a semiconductor device according to claim 1,
   wherein, in step (d), the second support pin is torn off by pressing the tie bar by an injection pressure of a sealing resin forming the sealing body to a resin molding die, and thereafter, a tip of the second support pin is covered by the sealing resin.

4. The manufacturing method of a semiconductor device according to claim 3,
   wherein, before injecting the sealing resin into the resin molding die, a block member is arranged with a clearance from the tie bar being provided, and thereafter, the sealing resin is injected.

5. The manufacturing method of a semiconductor device according to claim 4,
   wherein a groove portion or a step portion is formed in the second support pin.

6. The manufacturing method of a semiconductor device according to claim 1,
   wherein two die pads are provided and two second support pins connected to the two die pads, respectively, are arranged adjacent to each other.

7. The manufacturing method of a semiconductor device according to claim 6,
   wherein the two tie pads face each other and have a side to which any of the first, the second, and the third support pins is not connected.

8. The manufacturing method of a semiconductor device according to claim 1,
   wherein the semiconductor device includes a fourth support pin which supports any of the die pads and is connected to the tie bar.

9. The manufacturing method of a semiconductor device according to claim 1,
   wherein a folded portion is formed in an edge portion of each of the die pads.

10. The manufacturing method of a semiconductor device according to claim 9,
    wherein a bent portion is formed in at least any of the first, the second, and the third support pins.

11. A semiconductor device comprising:
a plurality of die pads, each of which includes an upper surface and a lower surface opposite to the upper surface, the upper surface forming a rectangular shape in plan view;
a plurality of support pins that support each of the die pads;
a plurality of inner leads arranged around the die pads;
a plurality of outer leads connected to each of the inner leads;
a semiconductor chip which includes a main surface and a back surface opposite to the main surface and in which a plurality of electrode pads is formed in the main surface, the semiconductor chip being mounted over the die pad so that the back surface faces the upper surface of the die pad;
a plurality of wires which electrically couple the electrode pads of the semiconductor chip to the inner leads respectively; and
a sealing body that seals the support pins, the inner leads, the semiconductor chip, and the wires,
wherein each of the die pads is arranged side by side,
the support pins include a first support pin connected to the outer lead, a second support pin arranged between any two of the inner leads, and a third support pin connected to a side of the die pad different from sides to which the first support pin and the second support pin are connected, and
wherein the first, the second, and the third support pins are integrally formed together with each of the die pads.

12. The semiconductor device according to claim 11,
wherein the second support pin is terminated inside the sealing body.

13. The semiconductor device according to claim 12,
wherein a tip of the second support pin is buried inside the sealing body.

14. The semiconductor device according to claim 11,
wherein a folded portion is formed in an edge portion of each of the die pads.

15. The semiconductor device according to claim 14,
wherein a bent portion is formed in at least any of the first, the second, and the third support pins.

* * * * *